(12) United States Patent
Hunt et al.

(10) Patent No.: US 11,004,656 B2
(45) Date of Patent: May 11, 2021

(54) METHODS AND APPARATUS FOR DETERMINING, USING, AND INDICATING ION BEAM WORKING PROPERTIES

(71) Applicant: Gatan, Inc., Pleasanton, CA (US)

(72) Inventors: John Andrew Hunt, Fremont, CA (US); Steven Thomas Coyle, Alameda, CA (US); Michael Patrick Hassel-Shearer, Little Haseley (GB); Thijs C Hosman, San Francisco, CA (US)

(73) Assignee: Gatan, Inc., Pleasanton, CA (US)

( * ) Notice: Subject to any disclaimer, the term of this patent is extended or adjusted under 35 U.S.C. 154(b) by 492 days.

(21) Appl. No.: 14/882,297

(22) Filed: Oct. 13, 2015

(65) Prior Publication Data

US 2016/0111249 A1 Apr. 21, 2016

Related U.S. Application Data

(60) Provisional application No. 62/064,399, filed on Oct. 15, 2014.

(51) Int. Cl.
*H01J 37/304* (2006.01)
*H01J 37/30* (2006.01)
(Continued)

(52) U.S. Cl.
CPC .............. *H01J 37/304* (2013.01); *G01N 1/44* (2013.01); *H01J 37/08* (2013.01); *H01J 37/243* (2013.01);
(Continued)

(58) Field of Classification Search
CPC .... H01J 37/3056; H01J 37/304; H01J 37/243; H01J 37/08; H01J 37/3178; H01J 37/30;
(Continued)

(56) References Cited

U.S. PATENT DOCUMENTS

| 4,800,100 A | * | 1/1989 | Herbots | ................ C23C 14/221 |
| | | | | 117/105 |
| 5,378,899 A | * | 1/1995 | Kimber | ................ H01J 37/026 |
| | | | | 250/398 |

(Continued)

FOREIGN PATENT DOCUMENTS

| JP | 2010-118290 | 5/2010 |
| JP | 2010118290 A | 5/2015 |

OTHER PUBLICATIONS

'Modulate' definition. Google online search engine [https://www.google.com/search?q=modulate&rlz=1C1GCEB_en&oq=modu&aqs=chrome.0.69i59j69i57j0l6.3551j0j1&sourceid=chrome&ie=UTF-8] [Accessed on Feb. 6, 2020] (Year: 2020).*

*Primary Examiner* — Michael A Band
(74) *Attorney, Agent, or Firm* — Snyder, Clark, Lesch & Chung, LLP

(57) ABSTRACT

Disclosed are embodiments of an ion beam sample preparation and coating apparatus and methods. A sample may be prepared in one or more ion beams and then a coating may be sputtered onto the prepared sample within the same apparatus. A vacuum transfer device may be used with the apparatus in order to transfer a sample into and out of the apparatus while in a controlled environment. Various methods to improve preparation and coating uniformity are disclosed including: rotating the sample retention stage; modulating the sample retention stage; variable tilt ion beam irradiating means, more than one ion beam irradiating means, coating thickness monitoring, selective shielding of the sample, and modulating the coating donor holder.

15 Claims, 13 Drawing Sheets

(51) Int. Cl.
*H01J 37/08* (2006.01)
*H01J 37/24* (2006.01)
*H01J 37/305* (2006.01)
*G01N 1/44* (2006.01)
*H01J 37/317* (2006.01)

(52) U.S. Cl.
CPC .......... *H01J 37/30* (2013.01); *H01J 37/3056* (2013.01); *H01J 37/3178* (2013.01); *H01J 2237/081* (2013.01); *H01J 2237/24514* (2013.01); *H01J 2237/24535* (2013.01); *H01J 2237/30483* (2013.01); *H01J 2237/3151* (2013.01)

(58) Field of Classification Search
CPC ............... H01J 37/305; H01J 37/32963; H01J 2237/24514; H01J 2237/24535; H01J 2237/3151; C23C 14/30; H01N 1/32; G01N 1/44; G01N 1/32
See application file for complete search history.

(56) References Cited

U.S. PATENT DOCUMENTS

| | | | |
|---|---|---|---|
| 6,768,110 B2* | 7/2004 | Alani | G01N 1/32 250/306 |
| 7,198,699 B2 | 4/2007 | Thomsen et al. | |
| 7,794,563 B2* | 9/2010 | Kubota | H01J 37/304 156/345.24 |
| 8,170,832 B2 | 5/2012 | Young et al. | |
| 2006/0065854 A1* | 3/2006 | Shichi | H01J 27/10 250/492.21 |
| 2008/0129209 A1 | 6/2008 | Deakins et al. | |
| 2009/0084757 A1 | 4/2009 | Erokhin et al. | |
| 2012/0067718 A1 | 3/2012 | Cox | |
| 2012/0085937 A1 | 4/2012 | Coyle et al. | |
| 2012/0135157 A1 | 5/2012 | Park et al. | |
| 2013/0032714 A1 | 2/2013 | Kitayama et al. | |
| 2014/0091237 A1 | 4/2014 | Coyle et al. | |

* cited by examiner

METHODS AND APPARATUS FOR DETERMINING, USING, AND INDICATING ION BEAM WORKING PROPERTIES

CROSS REFERENCE TO RELATED APPLICATIONS

This non-provisional utility application claims the benefit of provisional Application No. 62/064,399, filed Oct. 15, 2014, entitled "Methods and Apparatus for Determining, Using, and Indicating Ion Beam Working Properties". Application No. 62/064,399 is incorporated herein by reference.

STATEMENT REGARDING FEDERALLY SPONSORED RESEARCH OR DEVELOPMENT

Not Applicable.

DESCRIPTION OF ATTACHED APPENDIX

Not Applicable.

BACKGROUND

The present disclosure relates to the use of one or more ion beams to prepare materials for microscopic observation or spectroscopic analysis. Microscopic observational techniques include, but are not limited to: optical light microscopy (LM); scanning electron microscopy (SEM); transmission electron microscopy (TEM); scanning transmission electron microscopy (STEM); and reflection electron microscopy (REM). Spectroscopic analysis techniques include, but are not limited to: x-ray microanalysis; reflection electron energy-loss spectroscopy (REELS); electron back-scattered diffraction (EBSD); x-ray photoelectron spectroscopy (XPS); and Auger electron spectroscopy (AES). Materials to be viewed under any microscopic technique may require processing to produce a sample suitable for microscopic examination.

Microscopies making use of electrons to probe and image samples are important techniques for studying the detailed microstructure of many materials. The preparation of these samples for observation is very demanding. The goals of sample preparation are: preserve as many salient sample features as possible; avoid artifacts that might change, lose, or add additional information; render the sample stable for examination, in an observational environment, that may be carried out within a range of temperatures, vacuum conditions, charged particle fluxes, neutral particle fluxes, and to enable the observation of the sample as near to its natural state as possible.

Ion beam milling of a material can produce samples that are well suited for microscopic examination. Ion beam milling may be employed during sample preparation to thin, smooth, expose, and etch regions of interest in the sample for later microscopic study. An ion beam irradiating device may generate, accelerate, and direct a beam of ions toward a sample. The impact of ions on the sample will sputter material away from the area of ion impact. The sample surface may be polished by the ion beam to a substantially smooth condition, further enhancing observational properties of the sample. Regions of interest in the sample may be exposed and polished by the use of ion beams, thus making a suitable observational sample from the material under investigation. Furthermore, a sample may be etched by the action of one or more ion beams and may thereby be prepared to accept a coating on its surface.

Coating a sample with a carefully chosen coating material can produce samples with observational characteristics better than those achievable from the intrinsic properties of the sample material alone. Thin coatings of carbon, metals such as: gold; chromium; platinum; palladium; iridium; tungsten; tantalum, and other compounds can be used to coat a prepared sample and thereby produce changes in: conductivity; charge accumulation during observation; edge resolution during observation; thermal damage; secondary electron emission; backscattered electron emission; and mechanical stability.

Ion beam systems used to mill samples destined for microscopic analysis typically expose an interface or underlying structure of interest, or produce a sample with an electron-transparent region. Many of these systems have rotating samples and fixed beams, so that the beams may strike the sample from multiple directions. This provides for more uniform milling of a sample by compensating for the shadowing of certain regions that may happen due to the nonuniform topology of the sample surface. In the typical system used for ion beam milling, material is removed most quickly from the sample by the ion beam in the region of the sample described by the intersection of the rotation axis of the sample with the center of the ion beam itself.

Important considerations to users of ion beam milling techniques include: reducing or minimizing the time and effort the user is occupied in processing the sample; reducing or minimizing the number of steps where delicate samples are directly handled and at risk for damage, such as during mounting to sample holders for processing or analysis; reducing or minimizing the time and effort the user is occupied transferring the sample into the ultimate analysis equipment (imaging or spectroscopy) and aligning the coordinates of the prepared sample region to the ultimate analysis equipment prior to analysis; ensuring high quality and high probability of success in processing and imaging the sample; reducing or minimizing the time that the ion milling equipment and sample mounting equipment are occupied for each sample; and ensuring high-quality microscopy observation of the sample during sample mounting and ultimate analysis by reducing the working distance required between the sample and the objective or probe-forming lens used for observation.

Important considerations with respect to coating a sample with a coating material that enhances its properties during subsequent microscopic observation include: improving the spatial uniformity of coating; reducing the time required to coat a sample; improving the repeatability of the coating step; controlling the coating thickness; and improving the efficiency of the coating step.

In general, using one or more broad ion beams to prepare or coat a sample results in changes to the sample. While those changes may be measured by direct measurement of the sample, such direct measurement may not be desirable because it may interrupt the preparation or coating of the sample. Direct methods of assessing sample preparation or sample coating will generally require stopping the sample preparation or coating process, removal of the sample from the sample preparation or coating equipment, placement of the sample in other apparatus to conduct measurements, replacement of the sample in the original preparation or coating equipment, and recommencement of sample preparation or coating. While direct measurement may produce accurate measured values it does not provide fine control over the resulting sample preparation or coating. Direct measurement imposes a burdensome impact on the time required to prepare or coat a sample. In addition, the changes produced in a sample by the sample preparation and coating process can be difficult to anticipate in advance. An ion beam has a number of working properties and characteristics that may be difficult to control to an arbitrary setpoint. Since many difficulties arise from the foregoing considerations, it is clear that embodiments of the present disclosure confer numerous advantages and are therefore highly desirable.

SUMMARY

A summary of embodiments follows in which various features may be grouped together in a single embodiment for the purpose of streamlining the disclosure. This method of disclosure is meant to be illustrative of the teachings of the present disclosure and is not to be interpreted as reflecting that the claimed embodiments have more features than are expressly recited in each claim. Inventive subject matter may lie in less than all of the features disclosed in a single embodiment. Moreover, the scope of embodiments now described should be determined with reference to the appended claims along with the full scope of equivalents to which the claims in the present application are entitled.

Concept 1.1 (beam probe measuring a characteristic of the ion beam): An ion beam apparatus for preparing a sample according to an embodiment of the present disclosure comprises: an ion beam irradiating means disposed in a vacuum chamber directing a broad ion beam along a central ion beam axis; the broad ion beam comprising: a working portion directed toward said sample; and a monitoring portion; a sample retention stage configured to retain said sample in a predetermined position and orientation with respect to the central ion beam axis, a beam probe disposed to receive said monitoring portion of the broad ion beam; said beam probe operable to receive said monitoring portion substantially without altering said working portion of said broad ion beam; said beam probe operable to produce a probe signal responsive to one or more monitoring portion characteristics; said probe signal further characterized in that it is in a known relationship to one or more working portion characteristics.

Concept 1.2 (calibration data set allows estimation of a characteristic of the working portion based upon a measured characteristic of the monitoring portion): the apparatus of concept 1.1 in which one or more monitoring portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the one or more working portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the known relationship is a calibration data set that associates said one or more monitoring portion characteristics to said one or more working portion characteristics.

Concept 1.3 (modulating ion beam irradiating means responsive to beam probe signal to modulate ion beam characteristic): concept 1.1 or 1.2 further characterized in that the ion beam irradiating means is a modulating ion beam irradiating means operative to provide at least two levels of one or more ion beam characteristics selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and further characterized in that said modulating ion beam irradiating means is operative to modulate said one or more ion beam characteristics in response to said probe signal.

Concept 1.4A (adding tilting ion beam and incidence angle to prior concepts): the apparatus of concept 1.2 or 1.3, in which the ion beam irradiating means is a tilting ion beam irradiating means operable to provide at least two different angles of incidence between said central ion beam axis and said sample; and in which the calibration data set associates both: said one or more monitoring portion characteristics; and said angles of incidence; to said one or more working portion characteristics.

Concept 1.4B (adding tilting sample retention stage and incidence angle to prior concepts): the apparatus of concept 1.2 or 1.3, in which the sample retention stage is a modulating sample retention stage operable to provide at least two different angles of incidence between said central ion beam axis and said sample; and in which the calibration data set associates both of said one or more monitoring portion characteristics and said angles of incidence, to said one or more working portion characteristics.

Concept 1.5 (adding output signals to prior concepts): the apparatus of concepts 1.2 or 1.3 or 1.4, additionally comprising: an indicator that is responsive to said probe signal and said calibration data set to indicate said one or more working portion characteristics of the ion beam.

Concept 1.6 (indicating live milling rate characteristics): the apparatus of concept 1.2 or 1.3 or 1.4 or 1.5 in which the calibration data set additionally associates the probe signal to an instantaneous milling rate of the sample caused by ion flux reaching the sample from said working portion; the apparatus additionally comprising: an indicator that is responsive to said instantaneous milling rate.

Concept 1.7 (indicating live milling rate characteristics): the apparatus of concept 1.2 or 1.3 or 1.4 or 1.5 in which the calibration data set additionally associates the probe signal to an integrated milling rate of the sample caused by ion flux reaching the sample from said working portion; the apparatus additionally comprising: an indicator that is responsive to said integrated milling rate.

Concept 2.1 (beam probe measuring a characteristic of the ion beam): An ion beam apparatus for coating a sample with a coating material according to an concept of the present disclosure comprises: an ion beam irradiating means disposed in a vacuum chamber directing a broad ion beam along a central ion beam axis toward said coating material, the coating material being held in a predetermined position and orientation with respect to said central ion beam axis; the broad ion beam comprising: a working portion directed toward said coating material and producing a sputtered coating material; and a monitoring portion; a sample retention stage configured to retain said sample in a predetermined position and orientation with respect to said sputtered coating material, said sample disposed to receive a coating portion of said sputtered coating material; a beam probe disposed to receive said monitoring portion of the broad ion beam; said beam probe operable to receive said monitoring portion substantially without altering said working portion of said broad ion beam; said beam probe operable to produce a probe signal responsive to one or more monitoring portion characteristics; said probe signal further characterized in that it is in a known relationship to one or more coating portion characteristics.

Concept 2.2 (calibration data set allows estimation of a characteristic of the coating portion based upon a measured characteristic of the monitoring portion): the apparatus of concept 2.1 in which the one or more monitoring portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the one or more coating portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the known relationship is a calibration data set that associates said one or more monitoring portion characteristics to said one or more coating portion characteristics.

Concept 2.3 (modulating ion beam irradiating means responsive to beam probe signal to modulate ion beam characteristic): concept 2.1 or 2.2 further characterized in that the ion beam irradiating means is a modulating ion beam irradiating means operative to provide at least two levels of one or more ion beam characteristics selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and further characterized in that said modulating ion beam irradiating means is operative to modulate said one or more ion beam characteristics in response to said probe signal.

Concept 2.4A (adding tilting ion beam and incidence angle to prior concepts): the apparatus of concept 2.2 or 2.3, in which the ion beam irradiating means is a tilting ion beam irradiating means operable to provide at least two different angles of incidence between said central ion beam axis and said coating material; and in which the calibration data set associates said one or more monitoring portion characteristics and at least two angles of incidence to said one or more coating portion characteristics.

Concept 2.4B (adding tilting sample retention stage and incidence angle to prior concepts): the apparatus of concept 2.2 or 2.3, in which the sample retention stage is a modulating sample retention stage operable to modulate at least one of {position, orientation} of said sample; and in which the calibration data set associates said one or more monitoring portion characteristics and respectively at least one of {position, orientation, angle of incidence} to said one or more coating portion characteristics.

Concept 2.5 (adding output signals to prior concepts): the apparatus of concepts 2.2 or 2.3 or 2.4, additionally comprising: an indicator that is responsive to said probe signal and said calibration data set to indicate said one or more coating portion characteristics.

Concept 2.6 (indicating live coating rate characteristics): the apparatus of concept 2.2 or 2.3 or 2.4 or 2.5 in which the calibration data set additionally associates the probe signal to an instantaneous coating rate of the sample caused by said coating portion reaching the sample; the apparatus additionally comprising: an indicator that is responsive to said instantaneous coating rate.

Concept 2.7 (indicating live coating rate characteristics): the apparatus of concept 2.2 or 2.3 or 2.4 or 2.5 in which the calibration data set additionally associates the probe signal to an integrated coating rate of the sample caused by said coating portion reaching the sample; the apparatus additionally comprising: an indicator that is responsive to said integrated coating rate.

Concept 3.1 (beam probe and calibration probe used in creating calibration data set for ion beam milling of sample): An ion beam apparatus for creating a calibration data set relating one or more working portion characteristics of a broad ion beam to one or more monitoring portion characteristics of said ion beam, the apparatus comprising: an ion beam irradiating means disposed in a vacuum chamber directing a broad ion beam along a central ion beam axis; the broad ion beam comprising: a working portion directed toward a calibration probe; and a monitoring portion directed toward a beam probe; a calibration probe retention stage configured to retain said calibration probe in a predetermined position and orientation with respect to the central ion beam axis, said beam probe operable to receive said monitoring portion substantially without altering said working portion of said broad ion beam; said beam probe operable to produce a probe signal responsive to one or more monitoring portion characteristics; said calibration probe operable to receive said working portion and produce a calibration signal responsive to one or more working portion characteristics; and the apparatus further configured to create said calibration data set by associating one or more said probe signals with corresponding one or more said calibration signals.

Concept 3.2 (specific measured characteristics of the monitoring portion and the working portion): the apparatus of concept 3.1 in which the one or more monitoring portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the one or more working portion characteristics are selected from the list consisting of: {an instantaneous current of ions; an instantaneous flux of ions; an instantaneous flux of neutrals; a time-averaged current of ions; a time-averaged flux of ions;

a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}.

Concept 3.3 (modulating ion beam irradiating means): concept 3.1 or 3.2 further characterized in that the ion beam irradiating means is a modulating ion beam irradiating means operative to provide at least two levels of one or more ion beam characteristics selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}.

Concept 3.4A (adding tilting ion beam and incidence angle to prior concepts): the apparatus of Concept 3.2 or 3.3, in which the ion beam irradiating means is a tilting ion beam irradiating means operable to provide at least two different angles of incidence between said central ion beam axis and said calibration probe; the apparatus further configured to create said calibration data set by associating one or more said probe signals and one or more corresponding angles of incidence with corresponding one or more said calibration signals.

concept 3.4B (adding tilting sample retention stage and incidence angle to prior concepts): the apparatus of concept 3.2 or 3.3, in which the sample retention stage is a modulating sample retention stage operable to provide at least two different angles of incidence between said central ion beam axis and said sample; the apparatus further configured to create said calibration data set by associating one or more said probe signals and one or more corresponding angles of incidence with corresponding one or more said calibration signals.

Concept 4.1 (beam probe and calibration probe used in creating calibration data set for coating a sample): An ion beam apparatus for creating a calibration data set relating one or more coating portion characteristics of a sputtered coating material to one or more monitoring portion characteristics of a broad ion beam, the apparatus comprising: an ion beam irradiating means disposed in a vacuum chamber directing a broad ion beam along a central ion beam axis toward a coating material, the coating material being held in a predetermined position and orientation with respect to said central ion beam axis; the broad ion beam comprising: a working portion directed toward said coating material and producing a sputtered coating material; and a monitoring portion directed toward a beam probe; said beam probe disposed to receive said monitoring portion of the broad ion beam, operable to receive said monitoring portion substantially without altering said working portion of said broad ion beam, and operable to produce a probe signal responsive to one or more monitoring portion characteristics; a calibration probe retention stage configured to retain a calibration probe in a predetermined position and orientation with respect to said coating material; said calibration probe disposed to receive a coating portion of said sputtered coating material and operable to produce a calibration signal responsive to one or more coating portion characteristics; the apparatus further configured to create said calibration data set by associating one or more said probe signals with corresponding one or more said calibration signals.

Concept 4.2 (specific measured characteristics of the monitoring portion and the working portion): the apparatus of concept 4.1 in which the one or more monitoring portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}; and in which the one or more coating portion characteristics are selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}.

Concept 4.3 (modulating ion beam irradiating means): concept 4.1 or 4.2 further characterized in that the ion beam irradiating means is a modulating ion beam irradiating means operative to provide at least two levels of one or more ion beam characteristics selected from the list consisting of: {an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions}.

Concept 4.4A (adding tilting ion beam and incidence angle to prior concepts): the apparatus of concept 4.1 or 4.2 or 4.3, in which the ion beam irradiating means is a tilting ion beam irradiating means operable to provide at least two different angles of incidence between said central ion beam axis and said coating material; and in which the calibration data set associates said one or more monitoring portion characteristics and said at least two angles of incidence to said one or more coating portion characteristics.

BRIEF DESCRIPTION OF THE DRAWINGS

These and other features, aspects, and advantages of the present invention will become better understood with regard to the following description, appended claims, and accompanying drawings where:

LIST OF REFERENCE NUMBERS APPEARING IN THE FIGURES

Figure 1A:
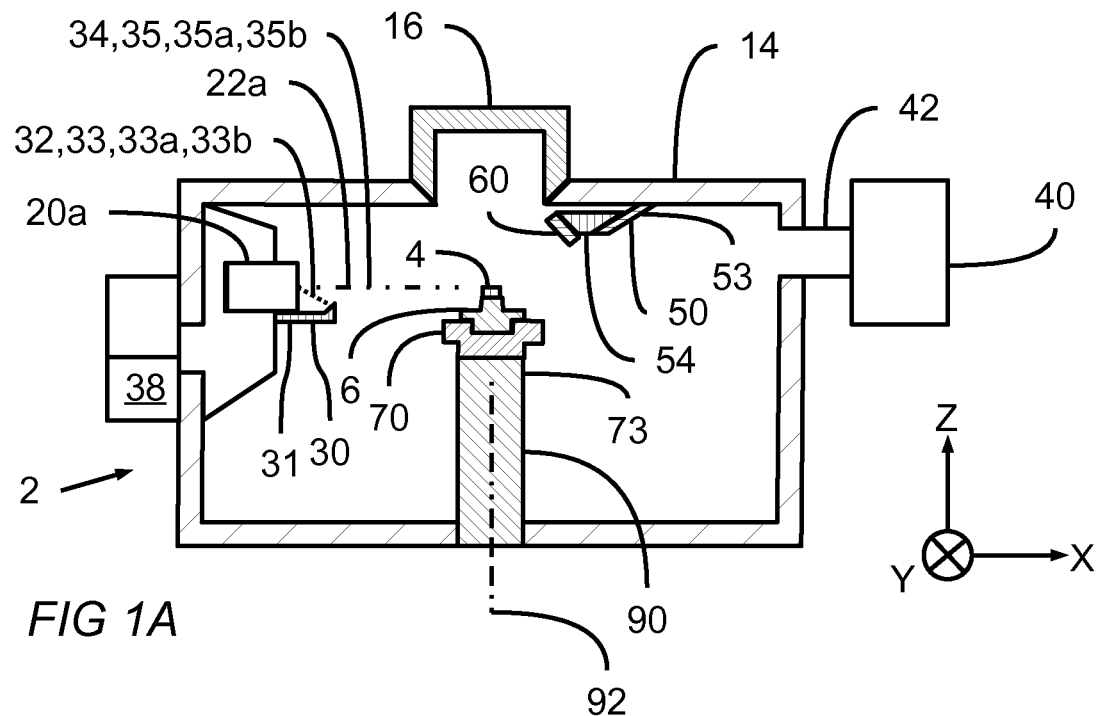
FIG. 1A shows a schematic cross sectional view of an ion beam sample preparation and coating apparatus according to the present disclosure. The figure shows sample retention stage in a milling position and coating donor translation stage in a quiescent position.

2—ion beam sample preparation and coating apparatus
3—ion beam apparatus for creating a calibration data set
4—sample
6—sample holder
14—vacuum chamber
16—chamber cover
18—loading chamber
20—ion beam irradiating means
20a, 20b—first, second ion beam irradiating means, etc.
21—ion beam characteristic
21a, 21b, . . . —first, second ion beam characteristic, etc.
22—central ion beam axis
22a, 22b—first, second central ion beam axis, etc.
24—tilt angle
24a, 24b—first, second, tilt angle, etc.
26—modulating ion beam irradiating means
28—tilt drive
30—beam probe
31—probe signal
32—monitoring portion
33—monitoring portion characteristic
33a, 33b, etc.—first, second monitoring portion characteristic etc.
34—working portion
35—working portion characteristic
35a, 35b, etc.—first, second ion beam working portion characteristic etc.
36—calibration probe
37—calibration signal
38—calibration data set
39—calibration probe retention stage
40—vacuum pumping means
42—vacuum manifold
42a, 42b—first, second vacuum manifold, etc.
50—coating donor translation stage
51—sputtering position
53—quiescent position
54—coating donor holder
56—modulating coating donor holder
60—coating material
62—sputtered coating material
64—coating portion
65—coating portion characteristic
65a, 65b etc.—first, second coating portion characteristic, etc.
70—sample retention stage
71—loading position
72—modulating sample retention stage
73—milling position
75—coating position
80—rotating sample retention stage
81—loading position
82—rotation axis
83—milling position
85—coating position
90—lifting drive
92—lifting axis
98—indicator
200—Process for operating an ion beam sample preparation apparatus for ion beam milling of a sample
202, 204, 206, 208, 210, 220—process steps of process 200
230—stopping condition for milling process
230a, 230b, etc.—first, second, etc. stopping condition for milling
300—Process for operating an ion beam coating apparatus for sputter coating of a sample with a coating material
302, 304, 306, 308, 310, 320—process steps of process 300

330—stopping condition for coating process

330a, 330b, etc.—first, second, etc. stopping condition for coating

400—Process for determining ion beam apparatus working properties and coating properties.

402, 406, 408, 416, 418, 420, 430, 438, etc.—process steps of process 400

DESCRIPTION

Embodiments of the present disclosure provide methods and apparatus for determining, using, and indicating the working properties of a broad ion beam when used for sample preparation or coating. Broad Ion Beam Slope-Cutting (BIBSC), also known as cross-section cutting using broad ion beam sources, ion beam milling, ion beam etching, or cross-section polishing using broad ion beam sources, is a rapid method for removing sample material to expose a smooth and substantially artifact-free cross-sectional surface for ultimate analysis by various microscopies and spectroscopies. A notable advantage of the BIBSC technique is high rates of surface preparation that can exceed tens or hundreds or thousands of square microns per hour, often over sample milling times of tens or hundreds of minutes. Using a broad ion beam to create a sputtered coating on a sample that has been freshly prepared in an ion beam can enhance numerous observational characteristics and durability properties of a sample. Embodiments of the disclosure present numerous beneficial apparatus and methods for performing these and other procedures.

In the embodiments of the present disclosure, broad ion beams preferably comprise noble gas ions. Non-noble gas ions may be used in other embodiments. Noble gas elements used for the ion beam may include but are not limited to: Argon, Xenon, and Krypton. The ion beam may also comprise a mixture of ions and neutrals. In other embodiments of the present disclosure ion beam intensity control means may be operative to control ion beam irradiating means such that one or more of the following characteristics of the ion beam may be controlled: gas flow, energy of the ions produced, number of ions produced per unit time, divergence of the emitted ion beam, and spatial distribution and shape of the emitted ion beam. In certain preferred embodiments the ion beam irradiating means may produce a beam energy about in the range of 100 eV to 10 KeV, and beam current about in the range of 10 microAmps to 100 micro Amps.

From the foregoing description it is clear that an ion beam produced by an ion beam irradiating means has a number of characteristics that describe the ion beam itself. When an ion beam or a portion of the ion beam reaches the target sample or target coating donor material it arrives with properties that may be described as the working properties of the ion beam. Working properties of the ion beam may include: current of ions reaching the target; flux of ions reaching the target, energy of ions reaching the target, spatial distribution of ions reaching the target; spatial distribution of ion energy reaching the target; angle of attack between ion beam and target. Once the working properties of the ion beam are known, one or more calibration points may be collected into a calibration data set allowing the inference of aspects of the ion beam's effect on the target including, but not limited to: instantaneous milling rate of the sample, integrated milling rate of the sample, instantaneous coating rate of sample, integrated coating rate of sample.

Embodiments of the presents disclosure provide an apparatus in which a beam probe is disposed to consume a monitoring portion of the ion beam and is operative to make measurements on the monitoring portion of the ion beam. The total output of the ion beam irradiating means may be described as the sum of: a monitoring portion of the ion beam; a working portion of the ion beam; and a remainder portion of the ion beam that is neither the monitoring portion nor the working portion. The beam probe removes the monitoring portion from the total ion beam. The working portion of the ion beam is available to work upon the sample or coating donor material. In preferred embodiments, the monitoring portion is a small fraction of the total output of the ion beam irradiating means. In preferred embodiments, the beam probe receiving the monitoring portion of the ion beam does so substantially without altering the working portion of the ion beam.

Some embodiments of the presents disclosure provide an apparatus in which the beam probe may be formed integrally with the ion beam irradiating means. In such embodiments the beam probe may be configured as a current probe to measure electron currents, ion currents, or a combination of electron and ion currents produced by or within the ion beam irradiating means. In an ion beam irradiating means, a discharge voltage may be used to create a gradient across a stream of gas atoms such that a plasma is generated. Ions within the generated plasma may then be accelerated by an accelerating voltage to ion energies effective for ion beam sample preparation or ion beam sputter coating. The accelerated ions may then be discharged from the acceleration region for subsequent beam forming or for use directly as an ion beam. The ion beam irradiating means may measure: electron current produced by the discharge voltage; electron current produced by the accelerating voltage; currents at other electrodes associated with the ion beam irradiating means; and voltages at other electrodes associated with the ion beam irradiating means. Current and/or voltage measurements may be suitably combined to arrive at a value that is representative of the ion current leaving the ion beam irradiating means.

The beam probe may be configured as a charged particle detector, such as a Faraday cup, operative to measure a process variable that is directly proportional to the number of ions present in the monitoring portion of the ion beam. Charged ions consumed by the Faraday cup from the monitoring portion of the ion beam create a charge that is directly related to the number of ions consumed. Charge measured by a Faraday cup beam probe may be substantially independent from the ion mass, ion energy, or ion chemistry of the constituents of the ion beam and hence is a preferred embodiment of a beam probe.

It may be desirable to measure other properties of the monitoring portion of the ion beam. Other embodiments of the beam probe may comprise a calorimeter operative to measure various energy related working properties of the portion of the ion beam consumed by the beam probe. Such a beam probe may be operative to measure: ion current; ion flux; average ion energy; peak ion energy; energy distribution of ions in the monitoring portion; and spatial distribution of ion energy in the monitoring portion of the ion beam. In other embodiments, a calorimeter may be used to measure the flux and energy of neutrals in the monitoring portion of the ion beam.

The disclosed improvements have the benefits of: reducing or minimizing the time and effort the user is occupied in processing the sample; reducing or minimizing the number of steps where delicate samples are directly handled and at risk for damage, such as during mounting to sample holders for processing or analysis; reducing or minimizing the time and effort the user is occupied transferring the sample into the ultimate analysis equipment (imaging or spectroscopy) and aligning the coordinates of the prepared sample region to the ultimate analysis equipment prior to analysis; ensuring high quality and high probability of success in processing and imaging the sample; reducing or minimizing the time that the ion milling equipment and sample mounting equipment are occupied for each sample; ensuring high-quality microscopy observation of the sample during sample mounting and ultimate analysis by reducing the working distance required between the sample and the objective or probe-forming lens used for observation; improving the spatial uniformity of coating; reducing the time required to coat a sample; improving the repeatability of the coating step; controlling the coating thickness; and improving the efficiency of the coating step.

Figure 1B:
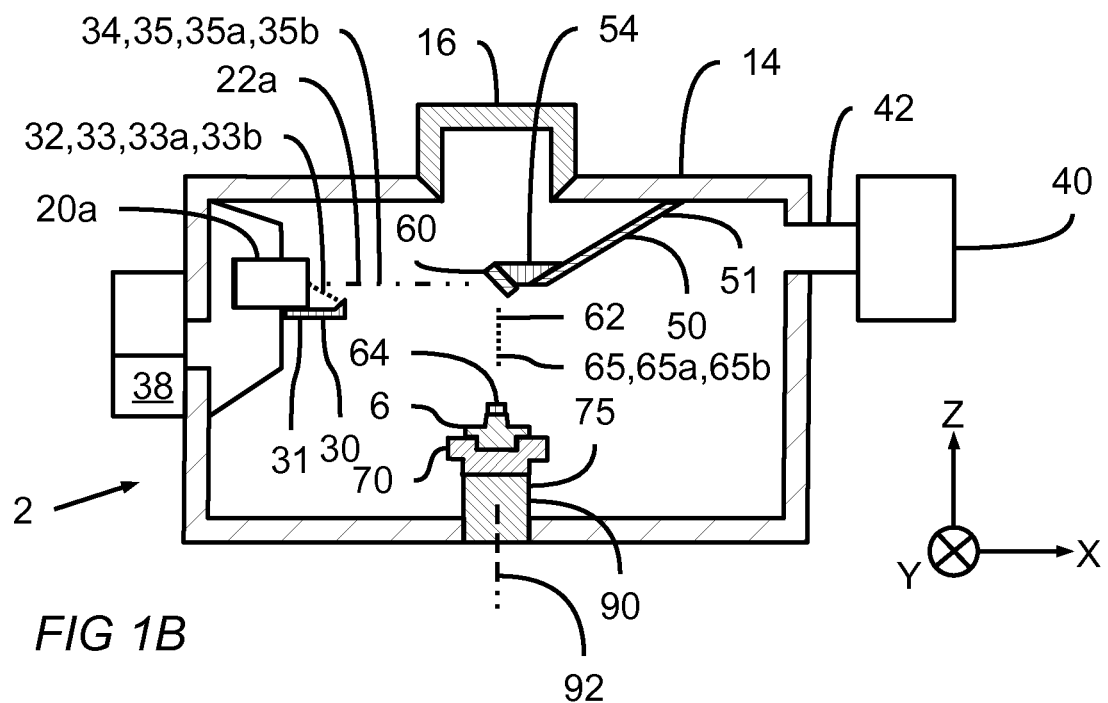
FIG. 1B shows a schematic cross sectional view of the same apparatus as FIG. 1A. The figure shows sample retention stage in a coating position and coating donor translation stage in a sputtering position.

Turning now to FIG. 1A and FIG. 1B, shown are views of an embodiment of an ion beam sample preparation and coating apparatus 2 for preparing a sample 4 and coating the sample with a coating material 60 according to an embodiment of the present disclosure comprising: a first ion beam irradiating means 20a disposed in a vacuum chamber 14, directing an ion beam along a first central ion beam axis 22a; a coating donor translation stage 50 which is operable to move between a sputtering position 51 and a quiescent position 53; coating donor translation stage 50 coupled to a coating donor holder 54, with coating donor holder 54 configured to hold coating material 60; sputtering position 51 characterized in that the coating donor holder 54 positions a portion of coating material 60 in the path of first central ion beam axis 22a, the interaction of the ion beam with coating material 60 creating a sputtered coating material 62 in vacuum chamber 14; quiescent position 53 characterized in that coating donor holder 54 positions none of coating material 60 in the path of first central ion beam axis 22a; also disposed in the vacuum chamber is a sample retention stage 70 configured to releasably retain a sample holder 6 which holds sample 4 in a predetermined position and orientation with respect to first central ion beam axis 22a. The apparatus also comprises: both a lifting drive 90 and a lifting axis 92, lifting drive 90 operable to move sample retention stage 70 along lifting axis 92 between a milling position 73 and a coating position 75; the milling position 73 characterized in that sample retention stage 70 is positioned to hold at least a portion of sample 4 in the path of first central ion beam axis 22a, and the coating position 75 characterized in that sample retention stage 70 is positioned so that none of sample 4 intersects first central ion beam axis 22a, and further characterized in that at least a portion of sample 4 is positioned to receive a coating portion 64 of sputtered coating material 62 present in the vacuum chamber. Chamber cover 16 is vacuum tight when in place on the vacuum chamber and is removable, thereby providing access to sample retention stage 70 for the purposes of both loading and unloading sample holder 6 from the apparatus. FIG. 1A shows sample retention stage 70 in milling position 73 and coating donor translation stage 50 in quiescent position 53. FIG. 1B shows sample retention stage 70 in coating position 75 and coating donor translation stage 50 in sputtering position 51.

With continuing reference to FIG. 1A, first ion beam irradiating means 20a produces a broad ion beam comprising: monitoring portion 32 directed toward beam probe 30; and working portion 34 directed toward sample 6. Beam probe 30 is disposed to receive monitoring portion 32 of the broad ion beam and is operable to receive the monitoring portion substantially without altering working portion 34 of the broad ion beam. Beam probe 30 is operable to produce probe signal 31 which is responsive to at least one monitoring portion characteristic 33. Probe signal 31 is further characterized in that it is in a known relationship to one or more working portion characteristics 35. A list of monitoring portion characteristics 33, 33a, 33b, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions. Similarly, a list of working portion characteristics 35, 35a, 35b, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions.

With continuing reference to FIG. 1A, probe signal 31, being in a known relationship to one or more working portion characteristics 35, 35a, 35b, etc., allows the estimation of those working portion characteristics from values of the probe signal. A way to arrive at said known relationship is to make use of a calibration data set 38. Calibration data set 38 is a set of one or more data tuples in which each tuple associates a specific probe signal value with specific values of the one or more working portion characteristics. Given calibration data set 38, there are numerous methods available in the art for the estimation and interpolation of working portion characteristics from live values of the probe signal acquired while operating the apparatus. In some embodiments, the probe signal may itself comprise one or more sub-signals, each of which may be represented in the calibration data set and associated with one or more working portion characteristics. It is noted that probe signal 31 may convey data related to a single measured variable or may convey data related to more than one measured variable.

With continuing reference to FIG. 1B, first ion beam irradiating means 20a produces a broad ion beam comprising: monitoring portion 32 directed toward beam probe 30; and working portion 34 directed toward coating material 60 and producing sputtered coating material. Beam probe 30 is disposed to receive monitoring portion 32 of the broad ion beam and is operable to receive the monitoring portion substantially without altering working portion 34 of the broad ion beam. Beam probe 30 is operable to produce probe signal 31 which is responsive to one or more monitoring portion characteristics 33. Probe signal 31 is further characterized in that it is in a known relationship to one or more coating portion characteristics 65, 65a, 65b, etc. A list of monitoring portion characteristics 33, 33a, 33b, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions. Similarly, a list of coating portion characteristics 65, 65a, 65b, etc. that may be of interest includes, but is not limited to: an instantaneous flux of coating material; a time-averaged flux of coating material; an integrated flux of coating material; an instantaneous spatial distribution of coating material; a time-averaged spatial distribution of coating material; and an integrated spatial distribution of coating material.

With continuing reference to FIG. 1B, probe signal 31, being in a known relationship to one or more coating portion characteristics 65, 65a, 65b, etc., allows the estimation of those characteristics of the coating portion from values of the probe signal. A way to arrive at said known relationship is to make use of calibration data set 38. A calibration data set is a set of one or more data tuples in which each tuple associates a specific probe signal value with specific values of the one or more coating portion characteristics. Given calibration data set 38, there are numerous methods available in the art for the estimation and interpolation of coating portion characteristics from live values of the probe signal acquired while operating the apparatus. In some embodiments, the probe signal may itself comprise one or more sub-signals, each of which may be represented in the calibration data set and associated with one or more coating portion characteristics.

Figure 1C:
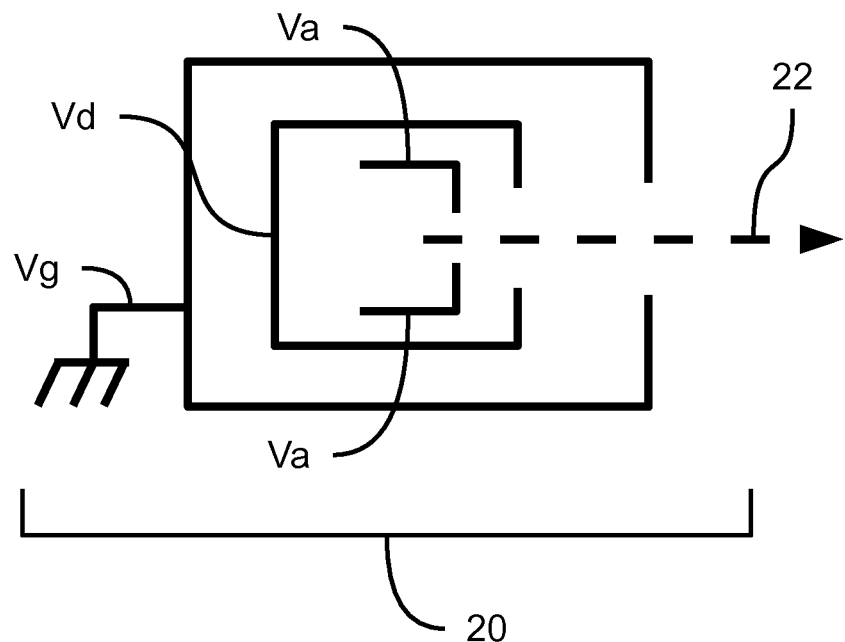
FIG. 1C shows a schematic representation of a beam probe suitable for use when ion beam irradiating means is configured as a Penning ion beam source.
Figure 1D:
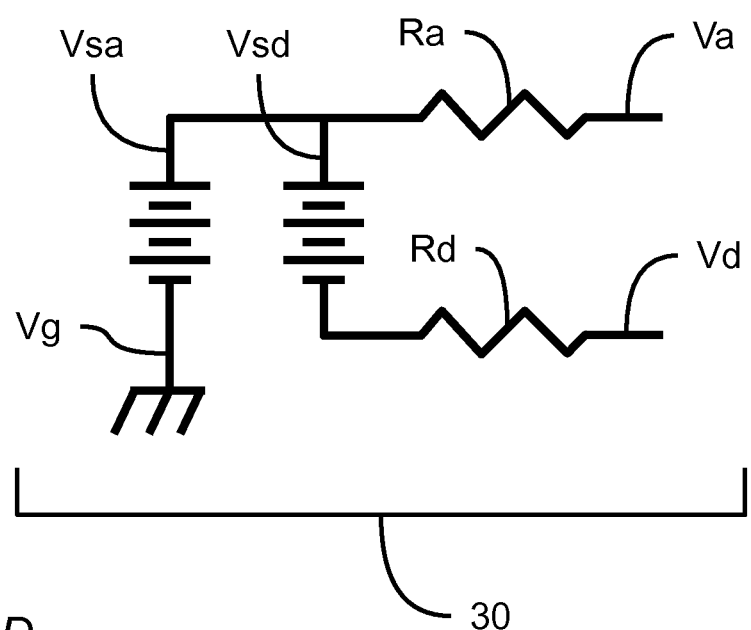
FIG. 1D shows an electrical schematic representation of a beam probe configuration that may be used with the apparatus of FIG. 1C.

FIG. 1C and FIG. 1D show an embodiment of beam probe 30 suitable for use when ion beam irradiating means 20 is configured as a Penning ion beam source. FIG. 1C shows a schematic representation of the electrodes in a Penning ion beam source comprising: a discharge electrode held at a discharge voltage Vd; an acceleration electrode held at an acceleration voltage Va, and a ground electrode held at a ground voltage Vg. Ions that have been accelerated are available to be discharged from ion beam irradiating means 20 along central ion beam axis 22. FIG. 1D shows an electrical schematic representation of a beam probe configuration that may be used with the apparatus of FIG. 1C. High voltage source Vsd supplies a discharge current through resistor element Rd at a high voltage potential to discharge electrode Vd, and high voltage source Vsa supplies a current through resistor Ra at a high voltage potential to acceleration electrode Va. A probe signal may be generated from the difference between discharge current and acceleration current. This probe signal is a representation of the ion current leaving ion beam irradiating means 20. In the embodiment of FIG. 1C and FIG. 1D the difference between discharge current and acceleration current provides the monitoring portion of the ion beam as it represents the net affect of creating ions via the discharge electrode and consuming a portion of those ions at the acceleration electrode.

Figure 2A:
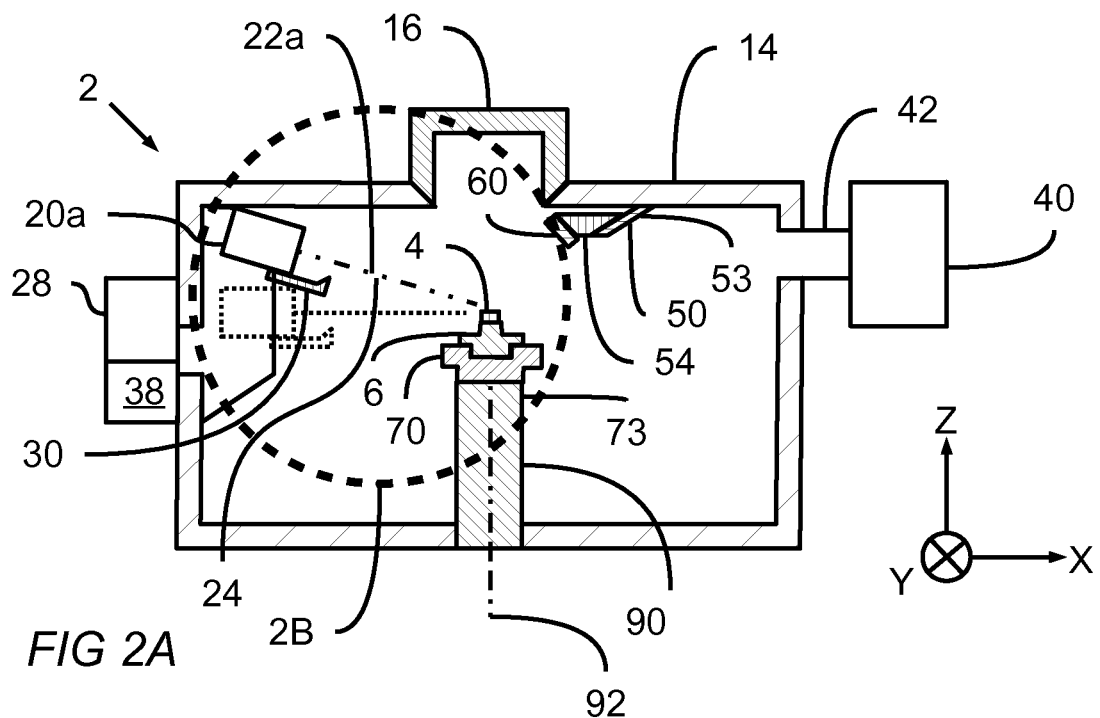
FIG. 2A shows a schematic cross sectional view of an ion beam sample preparation and coating apparatus according to another embodiment of the present disclosure in which the ion beam irradiating means has a variable tilt angle.
Figure 2B:
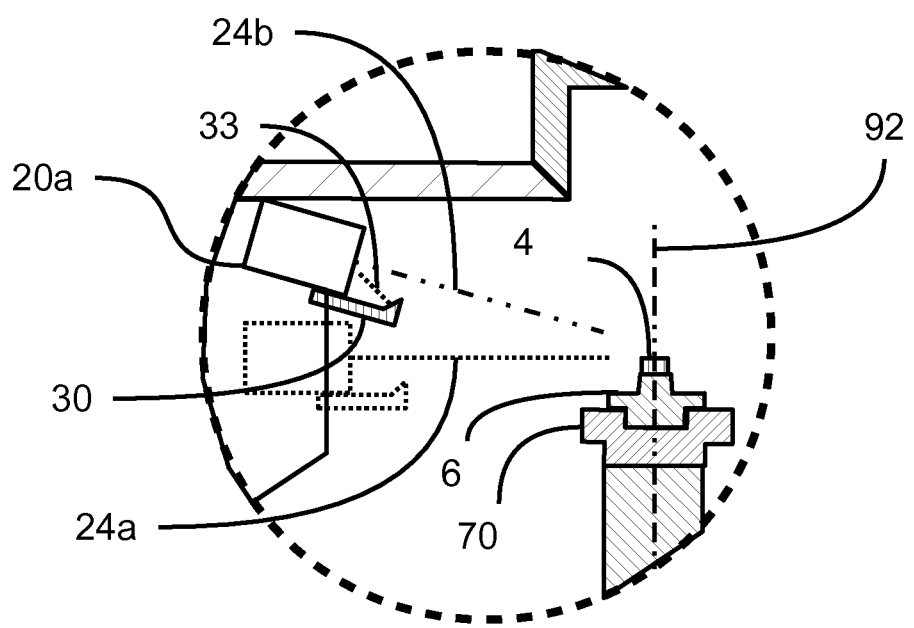
FIG. 2B shows an enlarged view of a portion of FIG. 2A showing multiple ion beam tilt angles.

As shown in FIG. 2A and FIG. 2B, the position and direction of first ion beam irradiating means 20a may be changed so that the angle of incidence of the central ion beam axis to the sample may be changed. In preferred embodiments the angle of incidence may have a range of about zero to about 20 degrees with respect to horizontal. Higher angles of incidence remove material from the sample more quickly, while lower angles of incidence produce a smoother surface with fewer artifacts. It can be seen with reference to FIG. 1A and FIG. 1B in combination with FIG. 2A and FIG. 2B that the apparatus may be further characterized in that the first central ion beam axis 22a may have a tilt angle 24 with respect to lifting axis 92 of the sample retention stage. The apparatus may additionally comprise a tilt drive 28 operably coupled to the first ion beam irradiating means and configured to move the direction of the first central ion beam axis between at least two different angles, a first tilt angle 24a and second tilt angle 24b. Changing the tilt angle may have beneficial effects on both the milling process and the coating process. In preferred embodiments, the tilting action of the tilt drive and the disposition of the sample holder within the vacuum chamber may be configured so that the central ion beam axis may strike substantially the same location on the sample regardless of the tilt angle of the ion beam. Beam probe 30 may be disposed in relation to first ion beam irradiating means 20a such that monitoring portion 32 received by beam probe 30 and having one or more monitoring portion characteristics 33, 33a, 33b, etc., is substantially unaffected by the tilt angle of the ion beam.

With continuing reference to FIG. 2A and FIG. 2B, beam probe 30 may be expected to produce a probe signal in like manner to the apparatus of FIG. 1A and FIG. 1B. The probe signal of FIG. 2A or FIG. 2B may be in a known relationship to one or more working portion characteristics 35, 35a, 35b, etc., thereby allowing the estimation of those working portion characteristics from values of the probe signal. The probe signal may also be in a known relationship to one or more coating portion characteristics 65, 65a, 65b, etc., thereby allowing the estimation of those characteristics of the coating portion from values of the probe signal. A preferred way to arrive at said known relationship is to make use of calibration data set 38. Calibration data set 38, consistent with embodiments in which the ion beam may take on more than one tilt angle, is a set of one or more data tuples in which each tuple associates a specific probe signal value and a specific tilt angle with specific values of the one or more working portion characteristics and/or the coating portion characteristics. Given calibration data set 38, there are numerous methods available in the art for the estimation and interpolation of working portion characteristics and/or the coating portion characteristics from live values of probe signal and tilt angle acquired while operating the apparatus. In some embodiments, the probe signal may itself comprise one or more sub-signals, each of which may be represented in the calibration data set and associated with one or more working portion characteristics and one or more the coating portion characteristics.

Figure 3A:
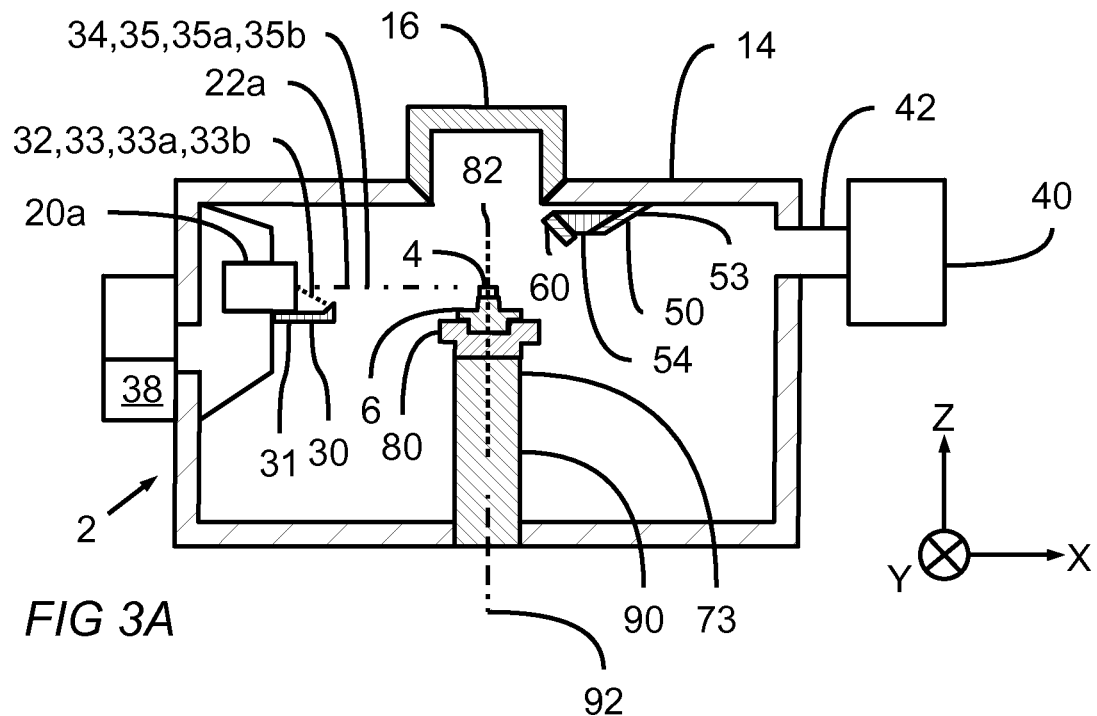
FIG. 3A shows a schematic cross sectional view of an ion beam sample preparation and coating apparatus according to the present disclosure in which the apparatus has a rotating sample retention stage. The figure shows rotating sample retention stage in a milling position and coating donor translation stage in a quiescent position.
Figure 3B:
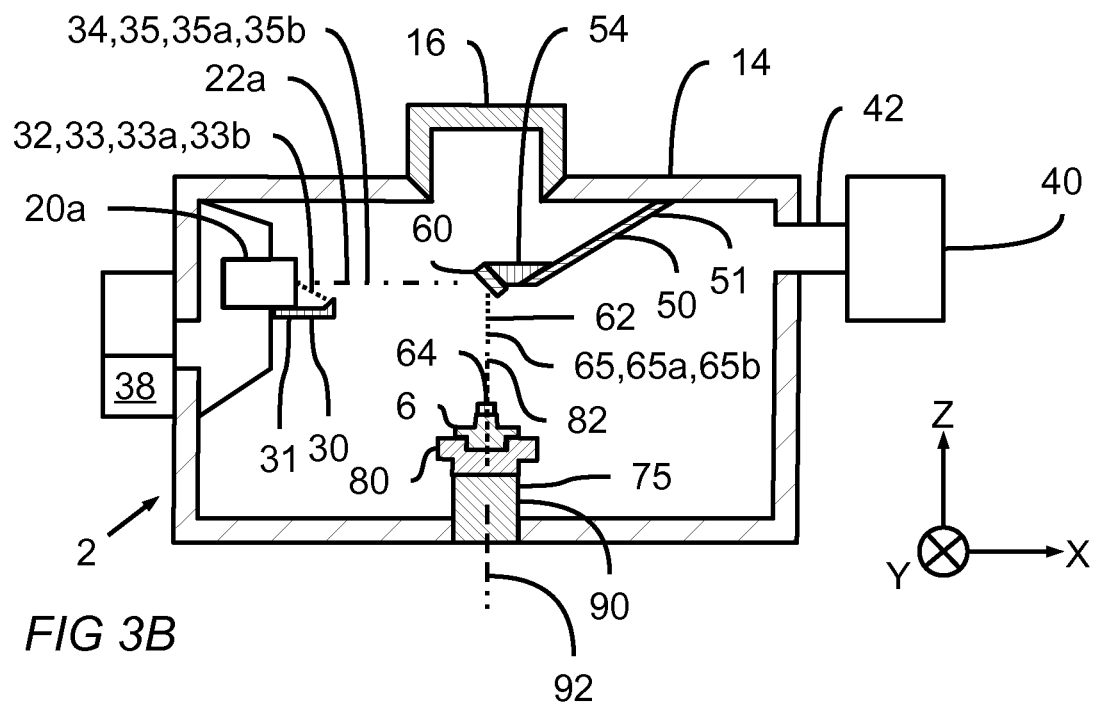
FIG. 3B shows a schematic cross sectional view of the same apparatus as FIG. 5A. The figure shows rotating sample retention stage in a coating position and coating donor translation stage in a sputtering position.

Turning to FIG. 3A and FIG. 3B, shown is an embodiment of an ion beam sample preparation and coating apparatus 2 for preparing a sample 4 and coating the sample with a coating material 60 according to an embodiment of the present disclosure comprising: a first ion beam irradiating means 20a disposed in a vacuum chamber 14, directing an ion beam along a first central ion beam axis 22a; a coating donor translation stage 50, which is operable to move between a sputtering position 51 and a quiescent position 53. The coating donor translation stage 50 is coupled to a coating donor holder 54, with coating donor holder 54 configured to hold coating material 60. Sputtering position 51 is characterized in that the coating donor holder 54 positions a portion of coating material 60 in the path of first central ion beam axis 22a, the interaction of the ion beam with coating material 60 creating a sputtered coating material in vacuum chamber 14. Quiescent position 53 is characterized in that coating donor holder 54 positions none of coating material 60 in the path of first central ion beam axis 22a. Also disposed in the vacuum chamber is a rotating sample retention stage 80 configured to releasably retain a sample holder 6 which holds sample 4 in a predetermined position and orientation with respect to first central ion beam axis 22a, rotating sample retention stage 80 having: a lifting drive 90; a lifting axis 92; and a rotation axis 82; lifting drive 90 operable to move rotating sample retention stage 80 along lifting axis 92 between a milling position 73 and a coating position 75; the milling position 73 characterized in that rotating sample retention stage 80 is positioned to hold at least a portion of sample 4 in the path of first central ion beam axis 22*a*, and the coating position 75 characterized in that rotating sample retention stage 80 is positioned so that none of sample 4 intersects first central ion beam axis 22*a* and further characterized in that at least a portion of sample 4 is positioned to receive a coating portion 64 of sputtered coating material 62 present in the vacuum chamber; and rotating sample retention stage 80, operable to rotate sample 4 about rotation axis 82 for at least a portion of one rotation. FIG. 3A shows rotating sample retention stage 80 in milling position 73 and coating donor translation stage 50 in quiescent position 53. FIG. 3B shows rotating sample retention stage 80 in coating position 75 and coating donor translation stage 50 in sputtering position 51.

With continuing reference to FIG. 3A, first ion beam irradiating means 20*a* produces a broad ion beam comprising: monitoring portion 32 directed toward beam probe 30; and working portion 34 directed toward sample 4. Beam probe 30 is disposed to receive monitoring portion 32 of the broad ion beam and is operable to receive the monitoring portion substantially without altering working portion 34 of the broad ion beam. Beam probe 30 is operable to produce probe signal 31, which is responsive to one or more monitoring portion characteristics 33. Probe signal 31 is further characterized in that it is in a known relationship to one or more working portion characteristics 35. A list of monitoring portion characteristics 33, 33*a*, 33*b*, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions. Similarly, a list of working portion characteristics 35, 35*a*, 35*b*, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions.

With continuing reference to FIG. 3B, first ion beam irradiating means 20*a* produces a broad ion beam comprising: monitoring portion 32 directed toward beam probe 30; and working portion 34 directed toward coating material 60 and producing sputtered coating material 62. Beam probe 30 is disposed to receive monitoring portion 32 of the broad ion beam and is operable to receive the monitoring portion substantially without altering working portion 34 of the broad ion beam. Beam probe 30 is operable to produce probe signal 31 which is responsive to one or more monitoring portion characteristics 33. Probe signal 31 is further characterized in that it is in a known relationship to one or more coating portion characteristics 65, 65*a*, 65*b*. A list of monitoring portion characteristics 33, 33*a*, 33*b*, etc. that may be of interest includes, but is not limited to: an instantaneous current of ions; an instantaneous flux of ions; an instantaneous flux of neutrals; a time-averaged current of ions; a time-averaged flux of ions; a time-averaged flux of neutrals; an integrated current of ions; an integrated flux of ions; an integrated flux of neutrals; an instantaneous energy of ions; a time-averaged energy of ions; an integrated energy of ions; an instantaneous energy distribution of ions; a time-averaged energy distribution of ions; and an integrated energy distribution of ions. Similarly, a list of coating portion characteristics 65, 65*a*, 65*b*, etc. that may be of interest includes, but is not limited to: an instantaneous flux of coating material; a time-averaged flux of coating material; an integrated flux of coating material; an instantaneous spatial distribution of coating material; a time-averaged spatial distribution of coating material; and an integrated spatial distribution of coating material.

During preparation and coating of the sample, rotating sample retention stage 80 may control the rotation about rotation axis 82. Rotating sample retention stage 80 may be configured to rotate through a full 360° of rotation or back and forth between two distinct angular positions. In addition, rotating sample retention stage 80 may be configured for either continuous or intermittent rotation. Rotating sample retention stage 80 may be further configured to measure the rotational position of the stage, and that measurement or sequence of measurements may be used to control position, speed, or acceleration of rotating sample retention stage 80. It is noted that rotation may be used during sample preparation, during coating, during both preparation and coating, or not at all. Also, a calibration data set may include at least one of: rotation angle, rotation speed, and rotational acceleration.

Also, during preparation of the sample, an ion beam intensity control means may vary the intensity of the ion beam so that at least two different beam intensities may be used during sample preparation, sample coating, or any combination of preparation and coating. In addition, during preparation of the sample, an ion beam tilt drive may vary the tilt angle of the ion beam so that at least two different tilt angles may be used during sample preparation. After the sample has been prepared and coated in the ion beam, the chamber cover may be removed; then the sample holder may be removed and the prepared and coated sample may be observed in a microscope.

With continuing reference to FIG. 3A and FIG. 3B, beam probe 30 may produce probe signal 31 in like manner to the apparatuses of FIG. 1A, FIG. 1B, FIG. 2A, and FIG. 2B. Probe signal 31 of FIG. 3A or FIG. 3B is in a known relationship to one or more working portion characteristics 35, 35*a*, 35*b*, etc., thereby allowing the estimation of those working portion characteristics from values of the probe signal. Probe signal 31 may also be in a known relationship to one or more coating portion characteristics 65, 65*a*, 65*b*, etc., thereby allowing the estimation of those characteristics of the coating portion from values of the probe signal. A way to arrive at said known relationship is to make use of a calibration data set. A calibration data set consistent with embodiments in which the rotating sample retention stage may take on more than one rotation angle is a set of one or more data tuples in which each tuple associates a specific probe signal value and a specific rotation angle with specific values of the one or more working portion characteristics and/or the coating portion characteristics. Given a calibration data set, there are numerous methods available in the art for the estimation and interpolation of working portion characteristics and/or the coating portion characteristics from live values of probe signal and rotation angle acquired while operating the apparatus. In some embodiments, the probe signal may itself comprise one or more sub-signals, each of which may be represented in the calibration data set and associated with one or more working portion characteristics and/or the coating portion characteristics.

Figure 4A:
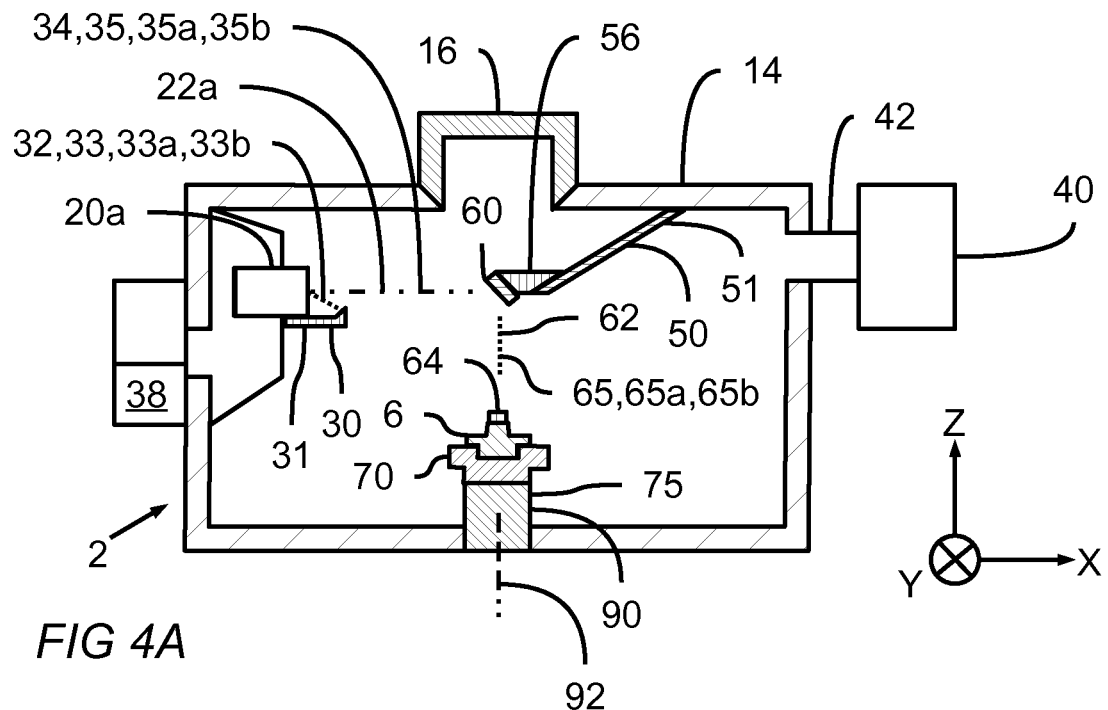
FIG. 4A shows a schematic cross sectional view of an apparatus according to the present disclosure in which the apparatus has a modulating coating donor holder.
Figure 4B:
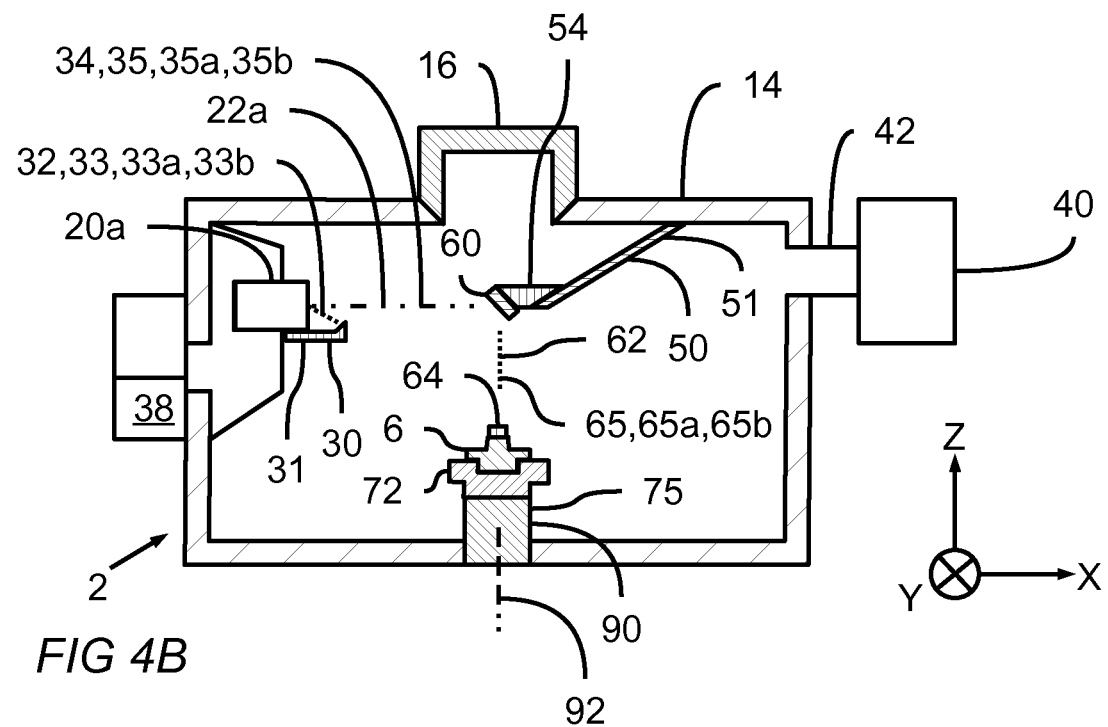
FIG. 4B shows a schematic cross sectional view of an apparatus according to the present disclosure in which the apparatus has a modulating sample retention stage, the sample retention stage being in a in a coating position.

Also within the scope of the present disclosure are other embodiments that may allow for improved uniformity of ion milling of the sample or sample coating produced by the coating process. The embodiment of FIG. 4A, similar to FIG. 1B and FIG. 3B, is further characterized in that the coating donor holder is a modulating coating donor holder 56 operable to modulate the position, orientation, or both position and orientation of the coating material when coating donor translation stage 50 is disposed in sputtering position 51. Another embodiment, shown in FIG. 4B and similar to FIG. 1B and FIG. 3B, is further characterized in that the sample retention stage is a modulating sample retention stage 72 operable to modulate the position, orientation, or both position and orientation of sample holder 6 when modulating sample retention stage 72 is in coating position 75. In preferred embodiments according to FIG. 4B, modulating sample retention stage 72 may be operable to modulate the position of sample holder 6 in an X-Y plane that is about perpendicular to lifting axis 92.

Figure 4C:
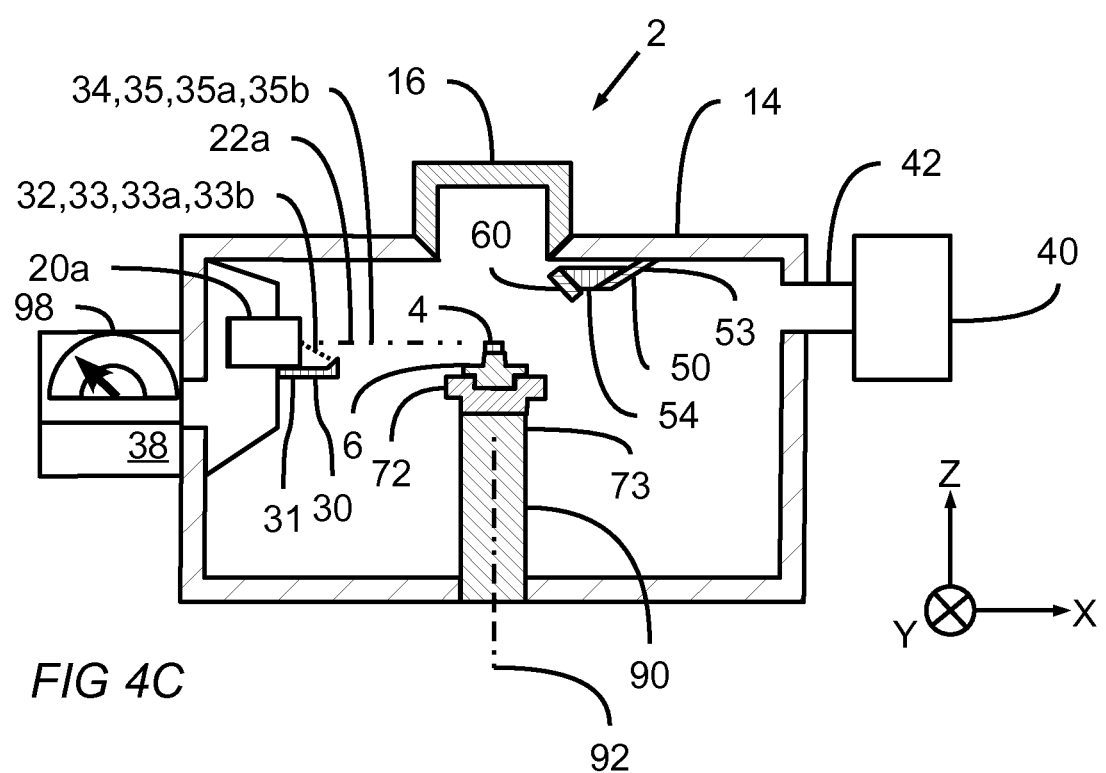
FIG. 4C shows a schematic cross sectional view of an apparatus according to the present disclosure in which the apparatus has a modulating sample retention stage, the sample retention stage being in a milling position.

The embodiment shown in FIG. 4C is similar to FIG. 1A and FIG. 3A, and is further characterized in that the sample retention stage is a modulating sample retention stage 72 operable to modulate the position, orientation, or both position and orientation of sample holder 6 when modulating sample retention stage 72 is in milling position 73. The apparatus of FIG. 4C additionally comprises indicator 98, which is responsive to probe signal 31 to indicate one or more monitoring portion characteristics 33, 33a, 33b, etc. of the ion beam. Indicator 98 may also be responsive to both the probe signal 31 and the calibration data set 38 to indicate one or more working portion characteristics 35, 35a, 35b, etc. or one or more characteristics derived from working portion characteristics. In preferred embodiments of the apparatus of FIG. 4C, indicator 98 may indicate milling rate of the sample, average milling rate of the sample, or integrated milling rate of the sample.

Figure 5A:
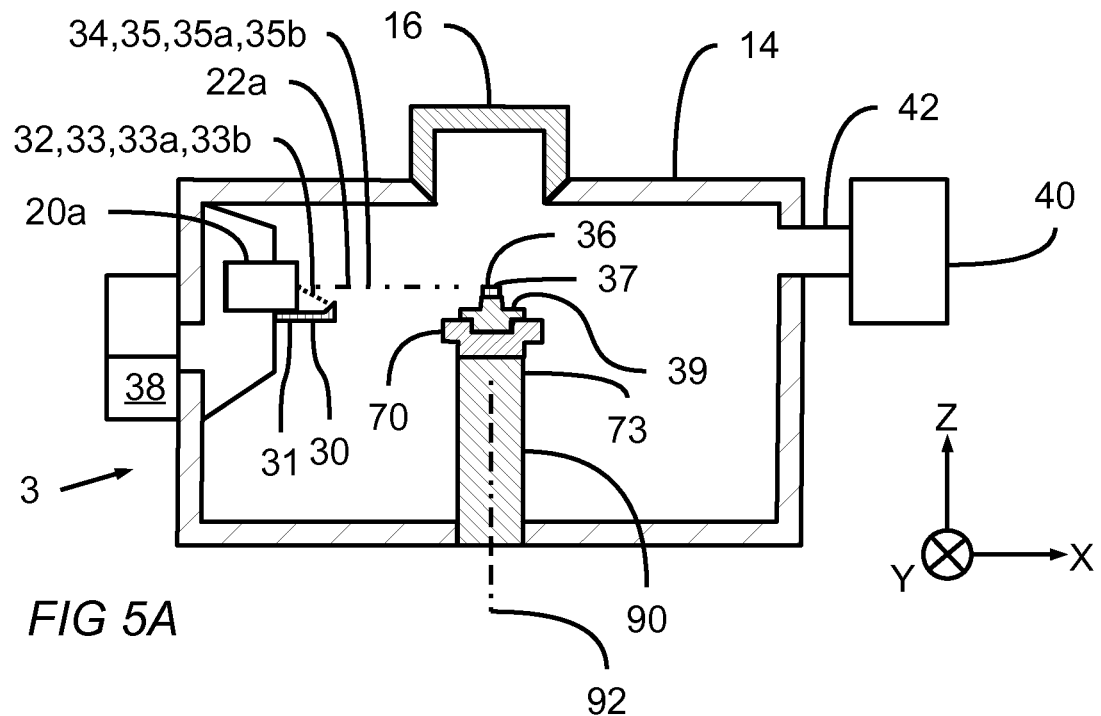
FIG. 5A shows an ion beam apparatus for creating a calibration data set relating one or more working portion characteristics of a broad ion beam to one or more monitoring portion characteristics of the ion beam.

Turning now to FIG. 5A, shown is an ion beam apparatus for creating a calibration data set 3 relating one or more working portion characteristics of a broad ion beam to one or more monitoring portion characteristics of said ion beam, the apparatus comprising: a first ion beam irradiating means 20a disposed in vacuum chamber 14 directing a broad ion beam along central ion beam axis 22a; the broad ion beam comprising: working portion 34 directed toward calibration probe 36; and monitoring portion 32 directed toward beam probe 30; calibration probe retention stage 39 configured to retain calibration probe 36 in a predetermined position and orientation with respect to central ion beam axis 22a; beam probe 36 operable to receive monitoring portion 32 substantially without altering the working portion of the broad ion beam; further characterized in that beam probe 30 is operable to produce a probe signal responsive to one or more monitoring portion characteristics 33, 33a, 33b, etc; further characterized in that calibration probe 36 is operable to receive working portion 32 and produce calibration signal 37, responsive to one or more working portion characteristics 35, 35a, 35b, etc; and the apparatus further configured to create a calibration data set by associating one or more said probe signals with corresponding one or more said calibration signals.

Figure 5B:
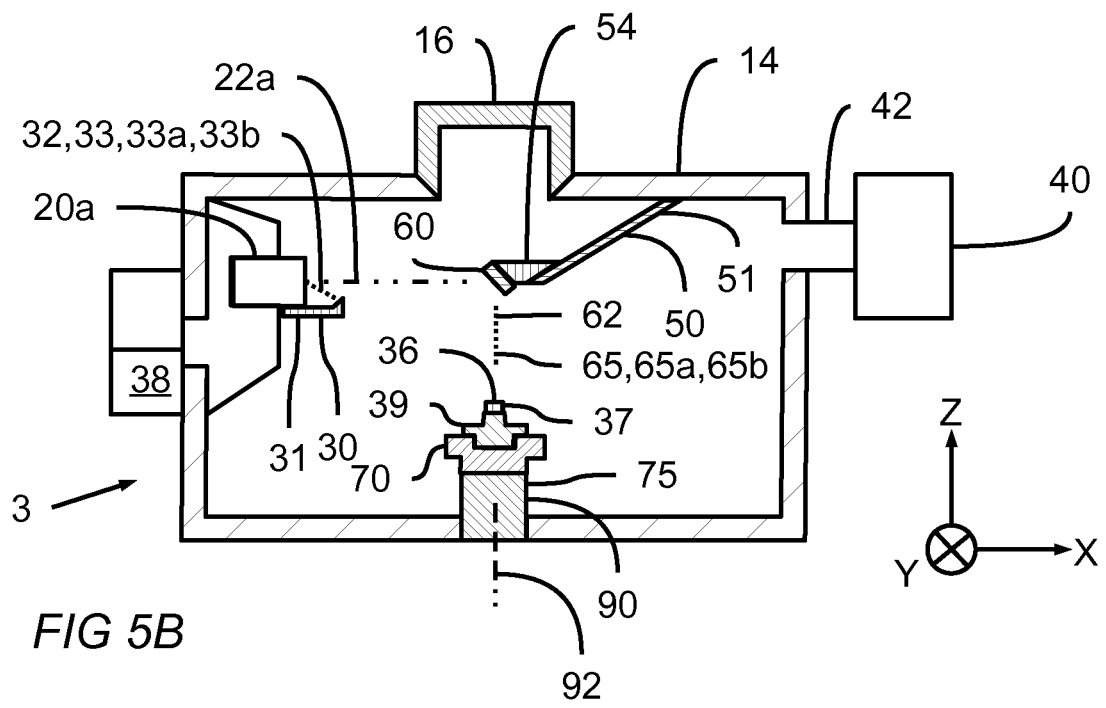
FIG. 5B shows an ion beam apparatus for creating a calibration data set relating one or more coating portion characteristics of a sputtered coating material to one or more monitoring portion characteristics of a broad ion beam.

Shown in FIG. 5B is an ion beam apparatus 3 for creating a calibration data set relating one or more coating portion characteristics 65, 65a, 65b, etc. of a sputtered coating material 62 to one or more monitoring portion characteristics 33, 33a, 33b, etc. of a broad ion beam, the apparatus comprising: first ion beam irradiating means 20a disposed in vacuum chamber 14 directing a broad ion beam along central ion beam axis 22a toward coating material 60, the coating material being held in a predetermined position and orientation with respect to said central ion beam axis 22a; the broad ion beam comprising: working portion directed toward said coating material 60 and producing sputtered coating material 62; and a monitoring portion 32 directed toward beam probe 30; further characterized in that beam probe 30 is disposed to receive monitoring portion 32 of the broad ion beam, and is operable to receive said monitoring portion substantially without altering the working portion of said broad ion beam, and operable to produce probe signal 31 responsive to one or more monitoring portion characteristics 33, 33a, 33b, etc.; calibration probe retention stage 39 configured to retain a calibration probe 36 in a predetermined position and orientation with respect to coating material 60; further characterized in that calibration probe 36 is disposed to receive a coating portion of said sputtered coating material and is operable to produce calibration signal 37, responsive to one or more coating portion characteristics 65, 65a, 65b, etc.; the apparatus further configured to create a calibration data set by associating one or more said probe signals with corresponding one or more said calibration signals.

Figure 6A:
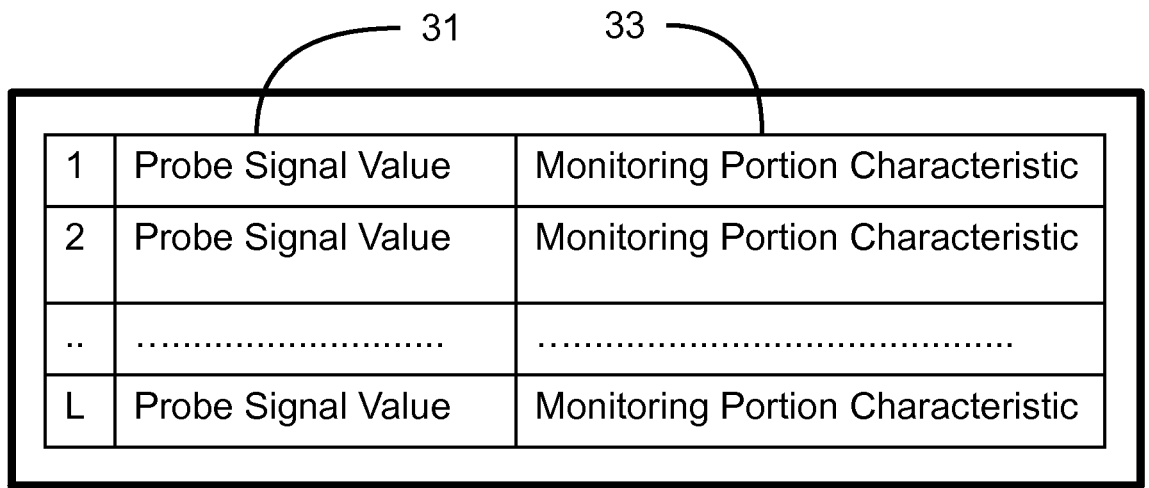
FIG. 6A-6D show schematic representations of a calibration data set establishing the relationship between probe signal values and monitoring portion characteristics.

Turning now to FIG. 6A-FIG. 6D, shown are schematic representations of calibration data set 38 establishing the relationship between probe signal 31 and monitoring portion characteristic 33 at various operational conditions of ion beam sample preparation apparatus according to any of the previously described embodiments of the disclosure. The calibration data set of FIG. 6A is shown having a number of entries identified by a number from 1 to L, where L is at least one. Each entry in calibration data set 38 comprises a data tuple having a probe signal value and its corresponding monitoring portion characteristic. Calibration data set 38 may have one or more entries corresponding to each operational condition of the ion beam sample preparation apparatus. Probe signal 31 may be a single signal value, may contain multiple distinct signal values, or may be a composite of more than one signal value.

Figure 6B:
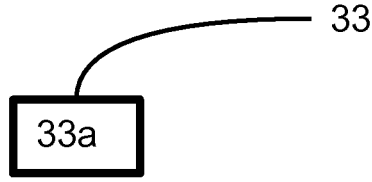
Figure 6C:
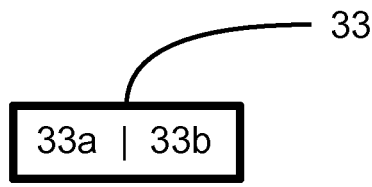
Figure 6D:
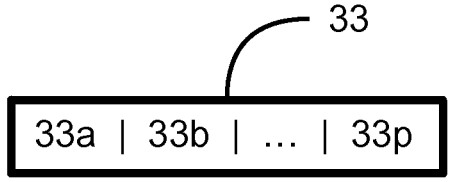

As indicated by FIG. 6B, FIG. 6C, and FIG. 6D, monitoring portion characteristic 33 may be: a single value corresponding to a first monitoring portion characteristic 33a; two distinct values corresponding to both first monitoring portion characteristic 33a and second monitoring portion characteristic 33b; or a plurality of distinct values corresponding respectively to a plurality of monitoring portion characteristics 33a, 33b, . . . , 33p.

Figure 7A:
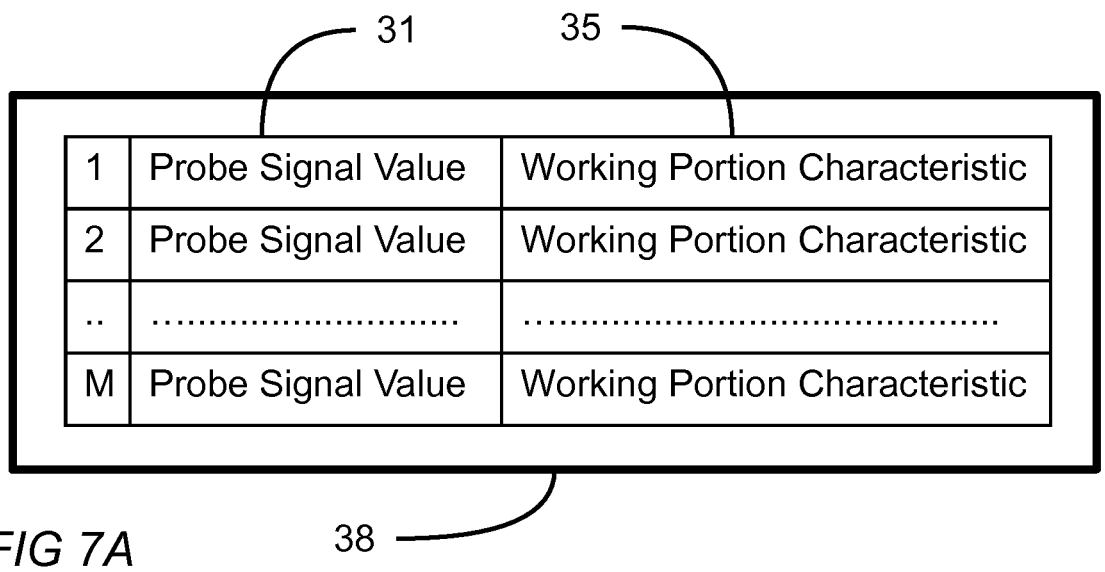
FIG. 7A-7D show schematic representations of a calibration data set establishing the relationship between probe signal values and working portion characteristics.

FIG. 7A-FIG. 7D show schematic representations of calibration data set 38 establishing the relationship between probe signal value 31 and working portion characteristic 35 at various operational conditions of ion beam sample preparation apparatus according to any of the previously described embodiments of the disclosure. The calibration data set of FIG. 7A is shown having a number of entries identified by a number from 1 to M, where M is at least one. Each entry in calibration data set 38 comprises a data tuple having a probe signal value and its corresponding working portion characteristic. Calibration data set 38 may have one or more entries corresponding to each operational condition of the ion beam sample preparation apparatus. Probe signal 31 may be a single signal value, may contain multiple distinct signal values, or may be a composite of more than one signal value.

Figure 7B:
Figure 7C:
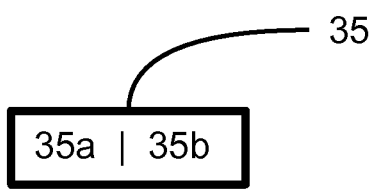
Figure 7D:

As indicated by FIG. 7B, FIG. 7C, and FIG. 7D, working portion characteristic 35 may be: a single value corresponding to a first working portion characteristic 35a; two distinct values corresponding to both first working portion characteristic 35a and second working portion characteristic 35b; or a plurality of distinct values corresponding respectively to a plurality of working portion characteristics 35a, 35b, 35q.

Figure 8A:
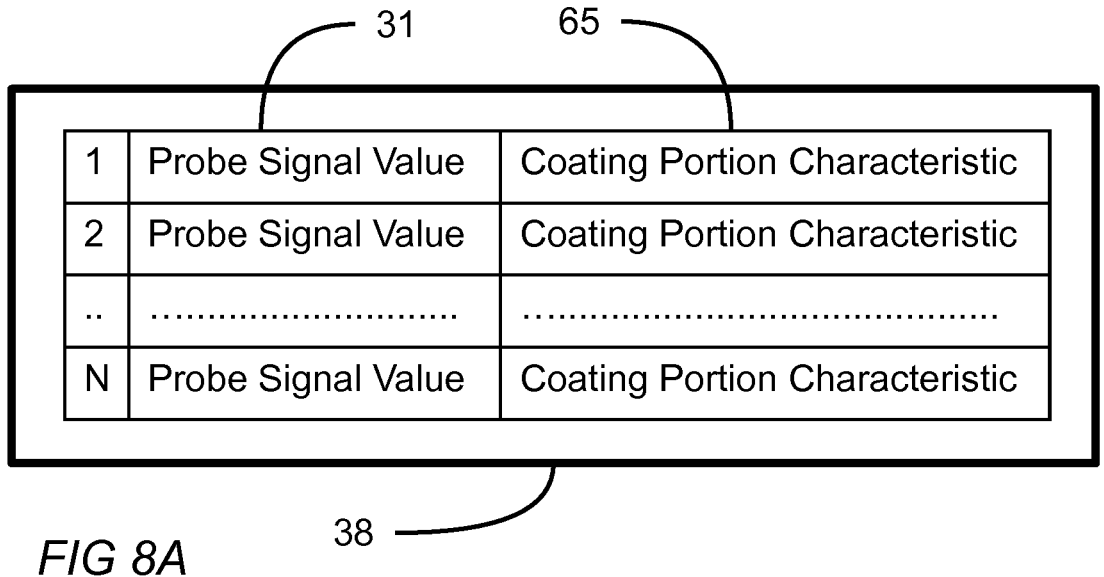
FIG. 8A-8D show schematic representations of a calibration data set establishing the relationship between probe signal values and coating portion characteristics.

FIG. 8A-FIG. 8D show schematic representations of calibration data set 38 establishing the relationship between probe signal value 31 and coating portion characteristic 65 at various operational conditions of ion beam sputter coating apparatus according to any of the previously described embodiments of the disclosure. The calibration data set of FIG. 8A is shown having a number of entries identified by a number from 1 to N, where N is at least one. Each entry in calibration data set 38 comprises a data tuple having a probe signal value and its corresponding coating portion characteristic. Calibration data set 38 may have one or more entries corresponding to each operational condition of the ion beam sputter coating apparatus. Probe signal 31 may be a single signal value, may contain multiple distinct signal values, or may be a composite of more than one signal value.

Figure 8B:
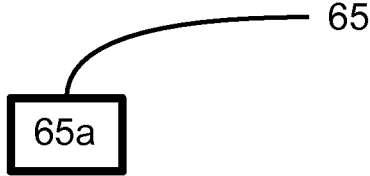
Figure 8C:
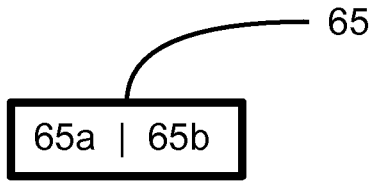
Figure 8D:
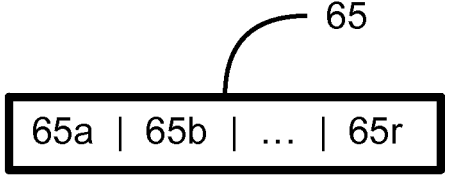

As indicated by FIG. 8B, FIG. 8C, and FIG. 8D, coating portion characteristic 65 may be: a single value corresponding to a first coating portion characteristic 65a; two distinct values corresponding to both first coating portion characteristic 65a and second coating portion characteristic 35b; or a plurality of distinct values corresponding respectively to a plurality of coating portion characteristics 65a, 65b, . . . , 65r.

Figure 9A:
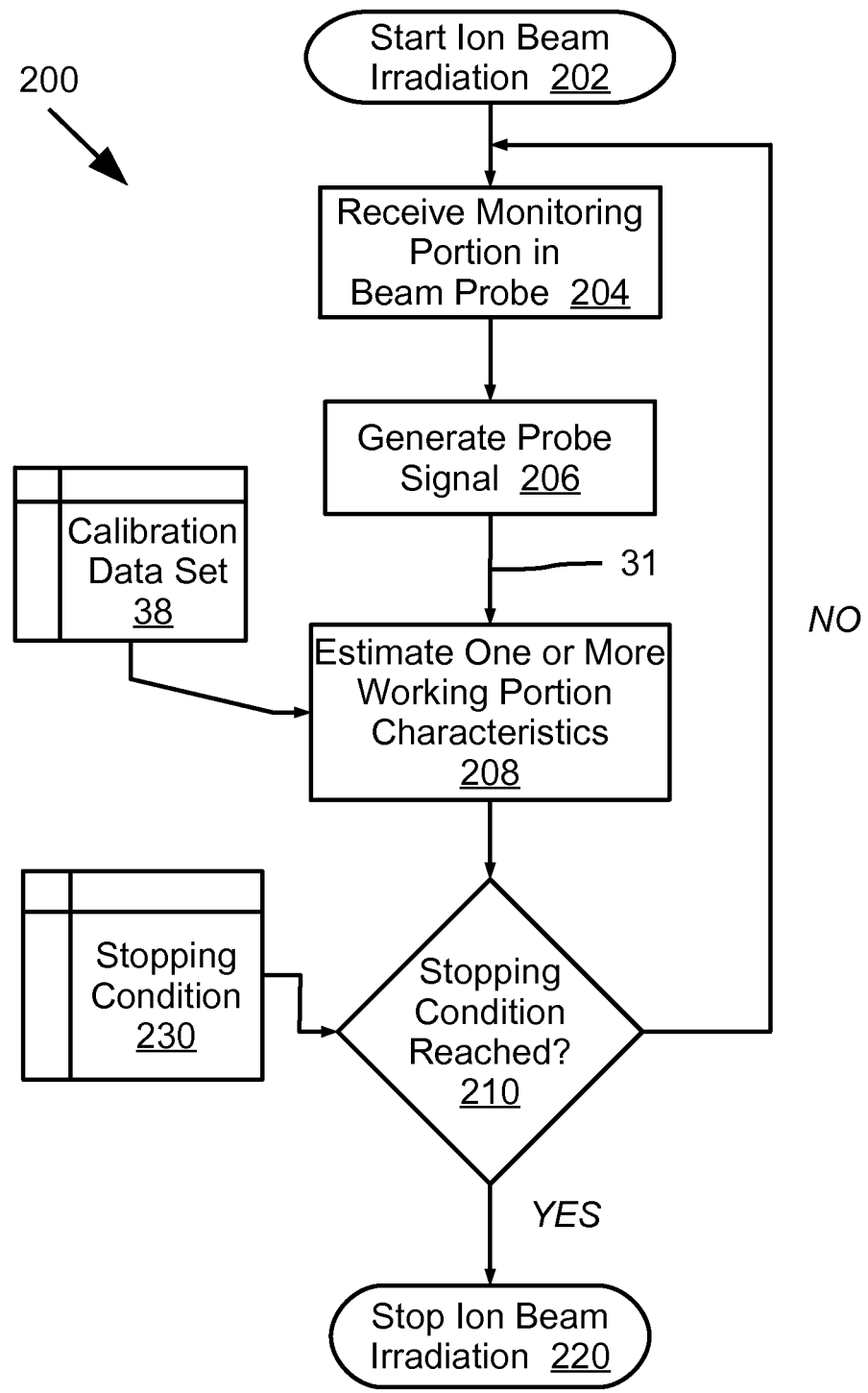
FIG. 9A shows a flow diagram of process steps involved in monitoring the progress of ion beam milling of a sample according and stopping the milling according to a stopping condition.

FIG. 9A shows a flow diagram of process steps involved in monitoring the progress of ion beam milling of a sample and stopping the milling according to a stopping condition. Proceeding with reference to any of the previously described apparatuses of FIG. 1A, FIG. 2A, FIG. 3A, and FIG. 4C, process 200 may proceed with reference to the following steps: Start Ion Beam Irradiation 202; Receive Monitoring Portion in Beam Probe 204; Generate Probe Signal 206; with calibration data set 38 and generated probe signal 31, Estimate One or More Working Portion Characteristics 208; with Stopping Condition 230 determine if Stopping Condition Reached? 210; if decision step 210 is YES then Stop Ion Beam Irradiation 220; if decision step 210 is NO then return to step Receive Monitoring Portion in Beam Probe 204.

Figure 9B:
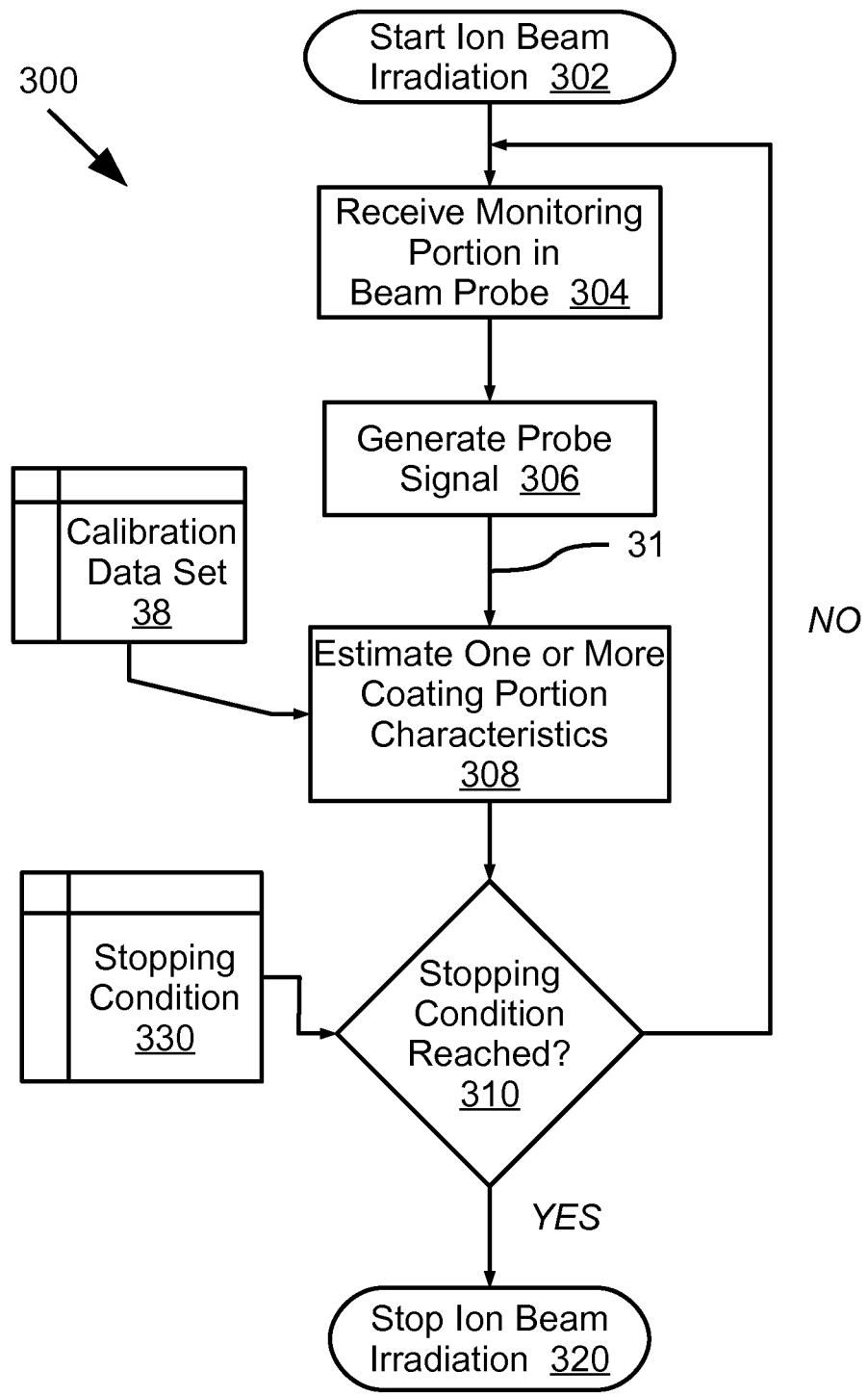
FIG. 9B shows a flow diagram of process steps involved in monitoring the progress of ion beam sputter coating of a sample and stopping the coating according to a stopping condition.

FIG. 9B shows a flow diagram of process steps involved in monitoring the progress of ion beam sputter coating of a sample and stopping the coating according to a stopping condition. Proceeding with reference to any of the previously described apparatuses of FIG. 1B, FIG. 2B, FIG. 3B, FIG. 4A, and FIG. 4B, process 300 may proceed with reference to the following steps: Start Ion Beam Irradiation 302; Receive Monitoring Portion in Beam Probe 304; Generate Probe Signal 306; with calibration data set 38 and generated probe signal 31, Estimate One or More Coating Portion Characteristics 208; with Stopping Condition 330 determine if Stopping Condition Reached? 210; if decision step 210 is YES then Stop Ion Beam Irradiation 220; if decision step 210 is NO then return to step Receive Monitoring Portion in Beam Probe 204.

Figure 10:
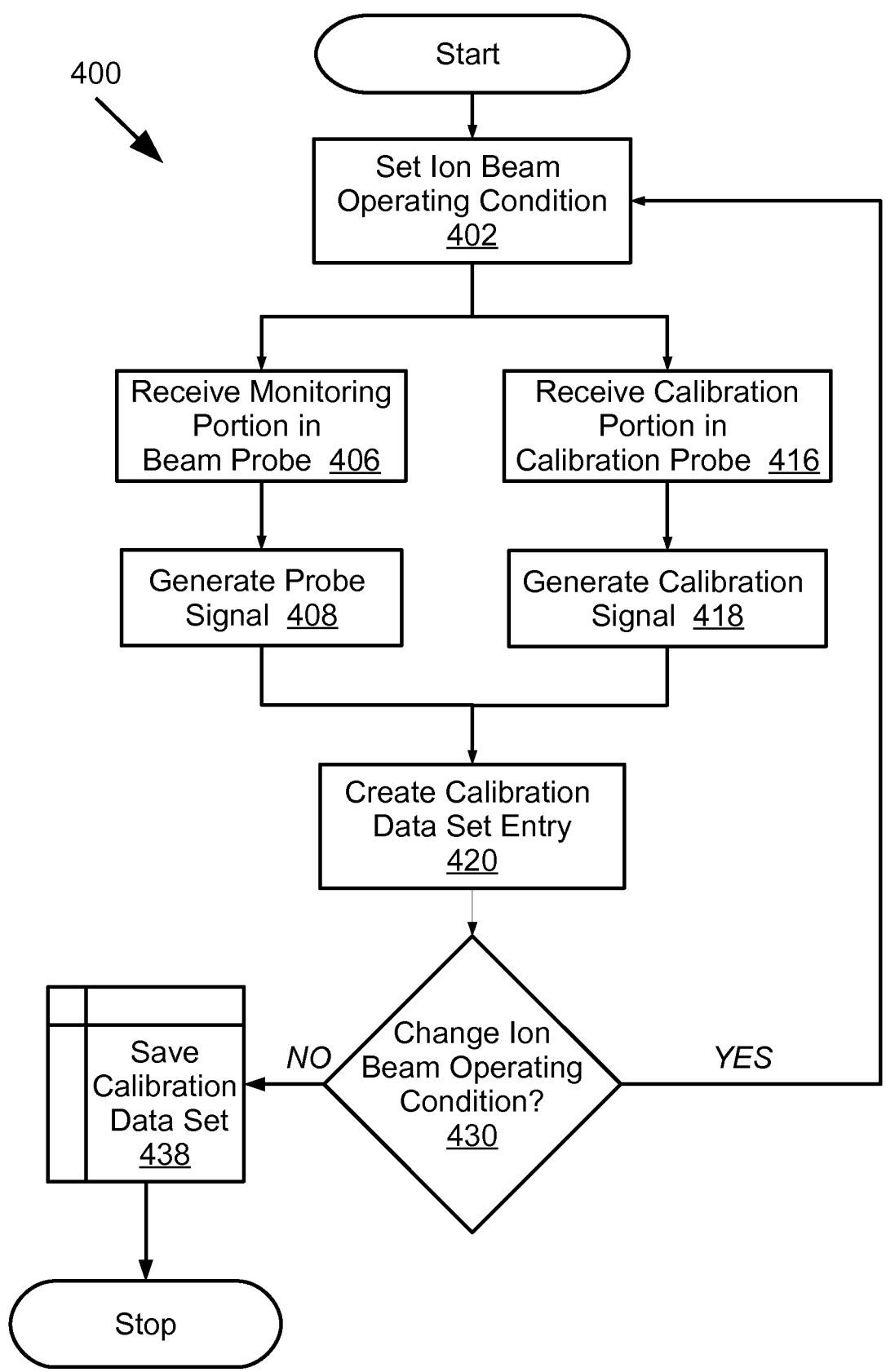
FIG. 10 shows a flow diagram of process steps that may be used with the apparatus of FIG. 5A and FIG. 5B for creating calibration data sets appropriate for use in ion beam milling of a sample and ion beam sputter coating of a sample.

With reference now to process 400 shown in FIG. 10, and with reference to the apparatus of FIG. 5A, a calibration data 38 set may be created that relates probe signal 31 to one or more corresponding ion beam working portion characteristics 35a, 35b, etc. Calibration probe 36 of FIG. 5A is responsive to one or more working portion characteristics 35a, 35b, etc. of the ion beam. Calibration probe 36 produces a calibration signal 37 that corresponds to the said one or more working portion characteristics. Process 400 may proceed with reference to the following steps: Set Ion Beam Operating Condition 402; Receive Monitoring Portion in Beam Probe 406; Generate Probe Signal 408; Receive Calibration Portion in Calibration Probe 416; Generate Calibration Signal 418; Create Calibration Data Set Entry 420; Change Ion Beam Operating Condition? 430; if decision in step 430 is YES then return to step Set Ion Beam Operating Condition 402; if decision in step 430 is NO then Save Calibration Data Set 438 produces a calibration data set 38 for use in ion beam sample preparation apparatus according to the embodiments previously described. In preferred embodiments, calibration probe 36 may be positioned and oriented with substantially the same position and orientation as a sample would have when the apparatus is used for ion beam sample preparation.

With reference now to process 400 shown in FIG. 10, with reference to the apparatus of FIG. 5B, a calibration data 38 set may be created relating probe signal 31 to one or more corresponding coating portion characteristics 65a, 65b, etc. Calibration probe 36 of FIG. 5B is responsive to one or more coating portion characteristics 65a, 65b, etc. of the ion beam sputtered coating. Calibration probe 36 produces a calibration signal 37 that corresponds to the said one or more coating portion characteristics. Process 400 may proceed with reference to the following steps: Set Ion Beam Operating Condition 402; Receive Monitoring Portion in Beam Probe 406; Generate Probe Signal 408; Receive Calibration Portion in Calibration Probe 416; Generate Calibration Signal 418; Create Calibration Data Set Entry 420; Change Ion Beam Operating Condition? 430; if decision in step 430 is YES then return to step Set Ion Beam Operating Condition 402; if decision in step 430 is NO then Save Calibration Data Set 438 produces a calibration data set 38 for use in ion beam sample coating apparatus according to the embodiments previously described. In preferred embodiments, calibration probe 36 may be positioned and oriented with substantially the same position and orientation as a sample would have when the apparatus is used for ion beam sputter coating of a sample.

The previously described processes: Process for operating an ion beam sample preparation apparatus for ion beam milling of a sample 200; Process for operating an ion beam coating apparatus for sputter coating of a sample with a coating material 300; and, Process for determining ion beam apparatus working properties and coating properties 400, are implementable in a computer as a multitude of executable instructions that are embeddable in a tangible computer readable medium. The executable instructions may be written using any computer language or format. Non-limiting examples include Ada, Ajax, C++, Cobol, Eiffel, Hypertext Markup Language (HTML), Java, Python, XML, etc. Tangible computer readable medium means any physical object or computer element that can store and/or execute computer instructions. Examples of tangible computer readable medium include, but are not limited to, a compact disc (CD), digital versatile disc (DVD), blu-ray disc (BD), usb floppy drive, floppy disk, random access memory (RAM), read-only memory (ROM), erasable programmable read-only memory (EPROM), optical fiber, etc. It should be noted that the tangible computer readable medium may even be paper or other suitable medium in which the instructions can be electronically captured, such as optical scanning Where optical scanning occurs, the instructions may be compiled, interpreted, or otherwise processed in a suitable manner, if necessary, and then stored in computer memory.

Alternatively, the tangible computer readable medium may be a plug-in or part of a software code that can be included in, or downloaded and installed into a computer application. As a plug-in, it may be embeddable in any kind of computer document, such as a web page, word document, PDF file, mp3 file, etc.

Although the present invention has been described in considerable detail with reference to certain preferred versions thereof, other versions are possible. It may be desirable to combine features shown in various embodiments into a single embodiment. A different number and configuration of features may be used to construct embodiments of ion beam probes and calibration probes that are entirely within the spirit and scope of the present disclosure. In addition, a different number and configuration of features may be used to construct embodiments of ion beam sample preparation and coating apparatus that are entirely within the spirit and scope of the present disclosure. Therefore, the spirit and scope of the appended claims should not be limited to the description of the preferred versions contained herein.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of the invention, even those disclosed solely in combination with other features of the invention, may be combined in any configuration excepting those readily apparent to the person skilled in the art as nonsensical. Likewise, use of the singular and plural is solely for the sake of illustration and is not to be interpreted as limiting. Except where the contrary is explicitly noted, the plural may be replaced by the singular and vice-versa.

In the present disclosure, the verb "may" is used to designate optionality/non-compulsoriness. In other words, something that "may" can, but need not. In the present disclosure, the verb "comprise" may be understood in the sense of including. Accordingly, the verb "comprise" does not exclude the presence of other elements/actions. In the present disclosure, relational terms such as "first," "second," "top," "bottom" and the like may be used solely to distinguish one entity or action from another entity or action without necessarily requiring or implying any actual such relationship or order between such entities or actions.

In the present disclosure, the term "any" may be understood as designating any number of the respective elements, e.g. as designating one, at least one, at least two, each or all of the respective elements. Similarly, the term "any" may be understood as designating any collection(s) of the respective elements, e.g. as designating one or more collections of the respective elements, a collection comprising one, at least one, at least two, each or all of the respective elements. The respective collections need not comprise the same number of elements.

In the present disclosure, the expression "at least one" is used to designate any (integer) number or range of (integer) numbers (that is technically reasonable in the given context). As such, the expression "at least one" may, inter alia, be understood as one, two, three, four, five, ten, fifteen, twenty or one hundred. Similarly, the expression "at least one" may, inter alia, be understood as "one or more," "two or more" or "five or more."

In the present disclosure, expressions in parentheses may be understood as being optional. As used in the present disclosure, quotation marks may emphasize that the expression in quotation marks may also be understood in a figurative sense. As used in the present disclosure, quotation marks may identify a particular expression under discussion.

In the present disclosure, many features are described as being optional, e.g. through the use of the verb "may" or the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

Any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

The invention claimed is:

1. An ion beam apparatus comprising:
   an ion beam irradiating means disposed in a vacuum chamber and configured to direct a working portion of a broad ion beam along a central ion beam axis to a sample;
   a beam probe directly attached to the ion beam irradiating means;
   wherein the ion beam irradiating means is further configured to direct a monitoring portion of the broad ion beam toward the beam probe;
   said ion beam irradiating means being a modulating ion beam irradiating means configured to provide one or more ion beam characteristics of the broad ion beam; and
   a sample retention stage configured to retain said sample in a predetermined position and orientation with respect to the central ion beam axis;
   wherein said beam probe is configured to receive said monitoring portion of the broad ion beam substantially without altering the working portion of said broad ion beam;
   wherein said beam probe is configured to measure from the monitoring portion at least one of electron current, ion current or ion energy and produce a probe signal based on the measured at least one of electron current, ion current or ion energy; and
   a device programmed to modulate the one or more ion beam characteristics of the broad ion beam based on the probe signal.

2. The ion beam apparatus of claim 1, further comprising:
   a calibration data set configured to store entries, wherein each entry associates a probe signal value with one or more values of one or more working portion characteristics, and
   wherein said modulating ion beam irradiation means is configured to use the calibration data set to modulate said ion beam in response to said probe signal.

3. The ion beam apparatus of claim 1, wherein the ion beam irradiating means is a tilting ion beam irradiating means configured to provide at least two different angles of incidence between said central ion beam axis and said sample, and wherein the ion beam irradiating means is responsive to receiving said probe signal and said angle of incidence by modulating said one or more ion beam characteristics.

4. The ion beam apparatus of claim 1, wherein the one or more ion beam characteristics comprises at least one of:
an instantaneous current of ions;
an instantaneous flux of ions;
an instantaneous flux of neutrals;
a time-averaged current of ions;
a time-averaged flux of ions;
a time-averaged flux of neutrals;
an integrated current of ions;
an integrated flux of ions;
an integrated flux of neutrals;
an instantaneous energy of ions;
a time-averaged energy of ions;
an integrated energy of ions;
an instantaneous energy distribution of ions;
a time-averaged energy distribution of ions; or
an integrated energy distribution of ions; and
wherein said probe signal has a known relationship to one or more characteristics of the working portion of the broad ion beam, said known relationship being stored in a calibration data set; and
wherein the ion beam apparatus further comprises:
an indicator responsive to said probe signal and said calibration data set to indicate said one or more characteristics of the working portion of the ion beam.

5. The ion beam apparatus of claim 2, wherein the calibration data set associates the probe signal to an instantaneous milling rate of the sample caused by ion flux reaching the sample from said working portion of the broad ion beam,
wherein the ion beam apparatus further comprises:
an indicator that is responsive to said instantaneous milling rate.

6. The ion beam apparatus of claim 2, wherein the calibration data set associates the probe signal to an integrated milling rate of the sample caused by ion flux reaching the sample from said working portion, and
wherein the ion beam apparatus further comprises:
an indicator that is responsive to said integrated milling rate.

7. An ion beam apparatus for creating a calibration data set associated with one or more characteristics of a broad ion beam, the apparatus comprising:
an ion beam irradiating means disposed in a vacuum chamber directing a broad ion beam along a central ion beam axis;
said ion beam irradiating means is a modulating ion beam irradiating means configured to provide the one or more characteristics;
the broad ion beam comprising a working portion directed toward a calibration probe and a monitoring portion directed toward a beam probe directly attached to the ion beam irradiating means;
a calibration probe retention stage configured to retain said calibration probe in a predetermined position and orientation with respect to the central ion beam axis,
said beam probe configured to receive said monitoring portion substantially without altering said working portion of said broad ion beam;
wherein the beam probe is configured to measure from the monitoring portion at least one of electron current, ion current or ion energy and produce one or more probe signals based on the measured at least one of electron current, ion current or ion energy;
said calibration probe configured to receive said working portion and produce a calibration signal responsive to the one or more characteristics of the working portion of the broad ion beam;
wherein the ion beam apparatus further comprises a device programmed to:
create said calibration data set by associating the one or more probe signals with corresponding one or more calibration signals; and
modulate the one or more characteristics of the broad ion beam based on the calibration data set.

8. The ion beam apparatus of claim 7, wherein the one or more characteristics of the broad ion beam for the monitoring portion comprise at least one of:
an instantaneous current of ions;
an instantaneous flux of ions;
an instantaneous flux of neutrals;
a time-averaged current of ions;
a time-averaged flux of ions;
a time-averaged flux of neutrals;
an integrated current of ions;
an integrated flux of ions;
an integrated flux of neutrals;
an instantaneous energy of ions;
a time-averaged energy of ions;
an integrated energy of ions;
an instantaneous energy distribution of ions;
a time-averaged energy distribution of ions; or
an integrated energy distribution of ions; and
wherein the one or more characteristics of the broad ion beam for the working portion comprise at least one of:
an instantaneous current of ions;
an instantaneous flux of ions;
an instantaneous flux of neutrals;
a time-averaged current of ions;
a time-averaged flux of ions;
a time-averaged flux of neutrals;
an integrated current of ions;
an integrated flux of ions;
an integrated flux of neutrals;
an instantaneous energy of ions;
a time-averaged energy of ions;
an integrated energy of ions;
an instantaneous energy distribution of ions;
a time-averaged energy distribution of ions; or
an integrated energy distribution of ions.

9. The ion beam apparatus of claim 7, wherein the ion beam irradiating means is a tilting ion beam irradiating means operable to provide at least two different angles of incidence between said central ion beam axis and said calibration probe; and
wherein the device is programmed to create said calibration data set by associating the one or more probe signals and one or more of the at least two different angles of incidence with the corresponding one or more calibration signals.

10. The ion beam apparatus of claim 7, further comprising:
a sample retention stage configured to retain a sample, wherein the sample retention stage is a modulating sample retention stage operable to provide at least two different angles of incidence between said central ion beam axis and said sample; and
wherein the device is programmed to create said calibration data set by associating the one or more probe signals and one or more of the at least two different angles of incidence with the corresponding one or more calibration signals.

11. An ion beam apparatus for preparing a sample comprising:
an ion beam irradiating means disposed in a vacuum chamber directing a broad ion beam along a central ion beam axis;
the broad ion beam comprising a working portion directed toward said sample;
the ion beam irradiating means being a modulating ion beam irradiating means configured to provide one or more ion beam characteristics comprising at least one of:
an instantaneous current of ions;
an instantaneous flux of ions;
an instantaneous flux of neutrals;
a time-averaged current of ions;
a time-averaged flux of ions;
a time-averaged flux of neutrals;
an integrated current of ions;
an integrated flux of ions;
an integrated flux of neutrals;
an instantaneous energy of ions;
a time-averaged energy of ions;
an integrated energy of ions;
an instantaneous energy distribution of ions;
a time-averaged energy distribution of ions; or
an integrated energy distribution of ions;
a sample retention stage configured to retain said sample in a predetermined position and orientation with respect to the central ion beam axis;
a beam probe directly attached to the ion beam irradiating means and configured to measure from a monitoring portion of the broad ion beam at least one of electron current, or ion current and to produce a probe signal based on the measured at least one of electron current or ion current;
said beam probe operating substantially without altering said working portion of said broad ion beam; and
a device programmed to modulate the one or more ion beam characteristics based on the probe signal.

12. The ion beam apparatus of claim 11, wherein the ion beam irradiating means comprises a discharge electrode held at a discharge voltage creating a plasma, and
wherein the beam probe is further configured to measure a discharge current flowing through said discharge electrode and use a value of at least one of said discharge current, or said discharge voltage in producing the probe signal.

13. The ion beam apparatus of claim 11, wherein the ion beam irradiating means comprises an acceleration electrode held at an acceleration voltage accelerating at least a portion of said working portion, and
wherein the beam probe further is further configured to measure an acceleration current flowing through said acceleration electrode and use a value of at least one of said acceleration current, or said acceleration voltage in producing the probe signal.

14. The ion beam apparatus of claim 11, wherein the ion beam irradiating means comprises an electrode operated at an electrode voltage effective for beam forming of at least a portion of said working portion, and
wherein the beam probe is further configured to measure a current flowing through said electrode and use a value of at least one of said current, or said electrode voltage in producing the probe signal.

15. The ion beam apparatus of claim 11, wherein the ion beam irradiating means comprises:
a discharge electrode operating at a discharge voltage creating a plasma;
an acceleration electrode operating at an acceleration voltage accelerating at least a portion of said plasma; and
wherein the beam probe further configured to:
measure a discharge current flowing through said discharge electrode;
measure an accelerating current flowing through said acceleration electrode; and
use a value of said discharge current and a value of said acceleration current in producing the probe signal.

* * * * *